United States Patent [19]

Maydan et al.

[11] Patent Number: 5,280,983
[45] Date of Patent: Jan. 25, 1994

[54] SEMICONDUCTOR PROCESSING SYSTEM WITH ROBOTIC AUTOLOADER AND LOAD LOCK

[75] Inventors: Dan Maydan, Los Altos Hills; Sasson R. Somekh, Redwood City; Charles Ryan-Harris, La Honda; Richard A. Seilheimer, Pleasanton; David Cheng, San Jose; Edward M. Abolnikov, San Francisco; Lance S. Reinke, San Jose; J. Christopher Moran, Mountain View; Richard M. Catlin, Jr., Foster City; Robert B. Lowrance, Santa Clara; Gregory W. Ridgeway, San Jose, all of Calif.

[73] Assignee: Applied Materials, Inc., Santa Clara, Calif.

[21] Appl. No.: 963,006

[22] Filed: Oct. 19, 1992

Related U.S. Application Data

[60] Continuation of Ser. No. 789,761, Nov. 7, 1991, abandoned, which is a continuation of Ser. No. 541,161, Jun. 18, 1990, abandoned, which is a continuation of Ser. No. 246,761, Sep. 20, 1988, Pat. No. 4,870,528, which is a division of Ser. No. 89,926, Aug. 25, 1987, Pat. No. 4,911,597, which is a continuation of Ser. No. 693,722, Jan. 22, 1985, abandoned.

[51] Int. Cl.$^5$ .................................................. B66C 1/42
[52] U.S. Cl. .................... 294/119.1; 294/106; 294/902; 414/416; 414/217; 414/753; 901/38
[58] Field of Search .................. 414/618, 739, 744, 8, 414/753, 417, 217, 416; 901/36, 38, 39; 294/902, 86.4, 86.26, 86.27, 119.1, 86.28, 90, 86.29, 99.1, 106; 204/298.25; 118/500, 719

[56] References Cited

U.S. PATENT DOCUMENTS

| | | |
|---|---|---|
| 3,255,893 | 6/1966 | Hainer et al. . |
| 3,516,386 | 6/1970 | Landwehr et al. . |
| 3,874,525 | 4/1975 | Hassan et al. . |
| 3,901,183 | 8/1975 | Wittkower ........................ 118/49.1 |
| 3,902,615 | 9/1975 | Levy et al. . |
| 4,141,458 | 2/1979 | Brooks et al. ........................ 427/39 |
| 4,208,159 | 6/1980 | Uehara et al. ........................ 414/225 |
| 4,311,427 | 1/1982 | Coad et al. . |
| 4,319,864 | 3/1982 | Kaufeldt ........................ 414/750 |
| 4,345,866 | 8/1982 | Greene ........................ 414/224 |
| 4,412,771 | 11/1983 | Gerlach et al. ........................ 414/217 |
| 4,417,845 | 11/1983 | Burton . |
| 4,449,884 | 5/1984 | Motoda ........................ 414/749 |
| 4,457,661 | 7/1984 | Flint et al. . |
| 4,473,455 | 9/1984 | Dean et al. . |
| 4,547,119 | 10/1985 | Chance et al. ........................ 414/735 |
| 4,553,069 | 11/1985 | Purser . |
| 4,604,026 | 8/1986 | Barrett ........................ 414/728 |
| 4,636,401 | 1/1987 | Yamazaki et al. . |

FOREIGN PATENT DOCUMENTS

| | | | |
|---|---|---|---|
| 48905 | 4/1982 | European Pat. Off. . | |
| 2808175 | 8/1979 | Fed. Rep. of Germany | 294/119.1 |
| 3300801 | 2/1984 | Fed. Rep. of Germany | 294/106 |
| 204436 | 11/1983 | German Democratic Rep. | 294/86.4 |
| 12568 | 1/1977 | Japan | 294/106 |
| 52-12568 | 1/1977 | Japan . | |
| 53-136257 | 11/1978 | Japan . | |
| 136257 | 11/1978 | Japan | 294/86.4 |
| 867648 | 9/1981 | U.S.S.R. | 294/86.4 |
| 876422 | 10/1981 | U.S.S.R. | 294/119.1 |
| 987628 | 10/1982 | U.S.S.R. . | |

OTHER PUBLICATIONS

Solid State Technology, vol. 28 No. 1 Jan. 1985 p. 74.
Applied Materials; product brochure "AME 8100 Series".
Plasma Etch System dated Oct. 1983.

*Primary Examiner*—Frank E. Werner
*Attorney, Agent, or Firm*—Philip A. Dalton

[57] ABSTRACT

A wafer processing system includes an autoloader mounted within a load lock for providing batch, cassette-to-cassette automatic wafer transfer between the semiconductor processing chamber and cassette load and unload positions within the load lock. The system provides rapid, contamination-free loading and unloading of semiconductor wafers.

16 Claims, 13 Drawing Sheets

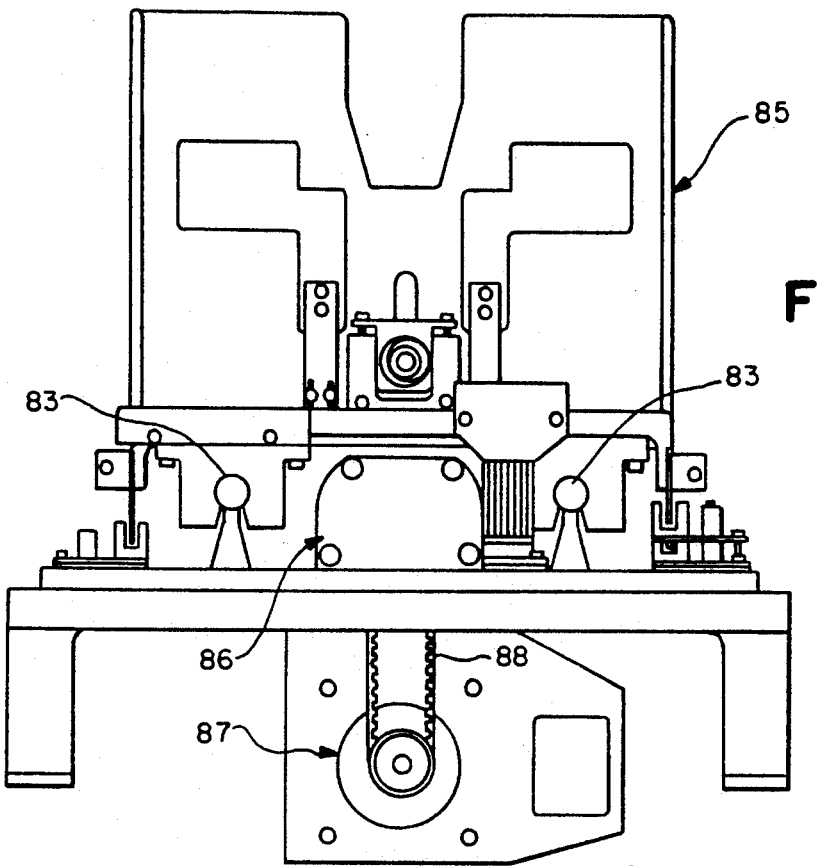
FIG.-8
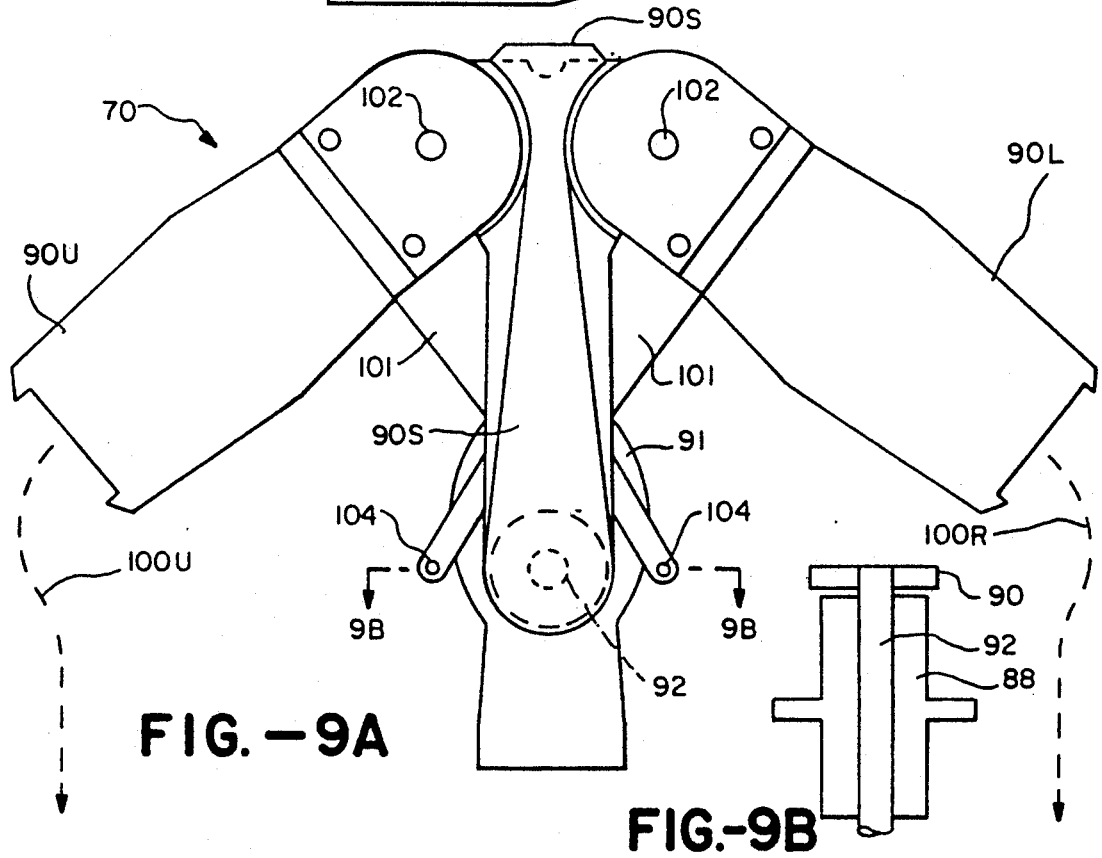
FIG.-9A
FIG.-9B

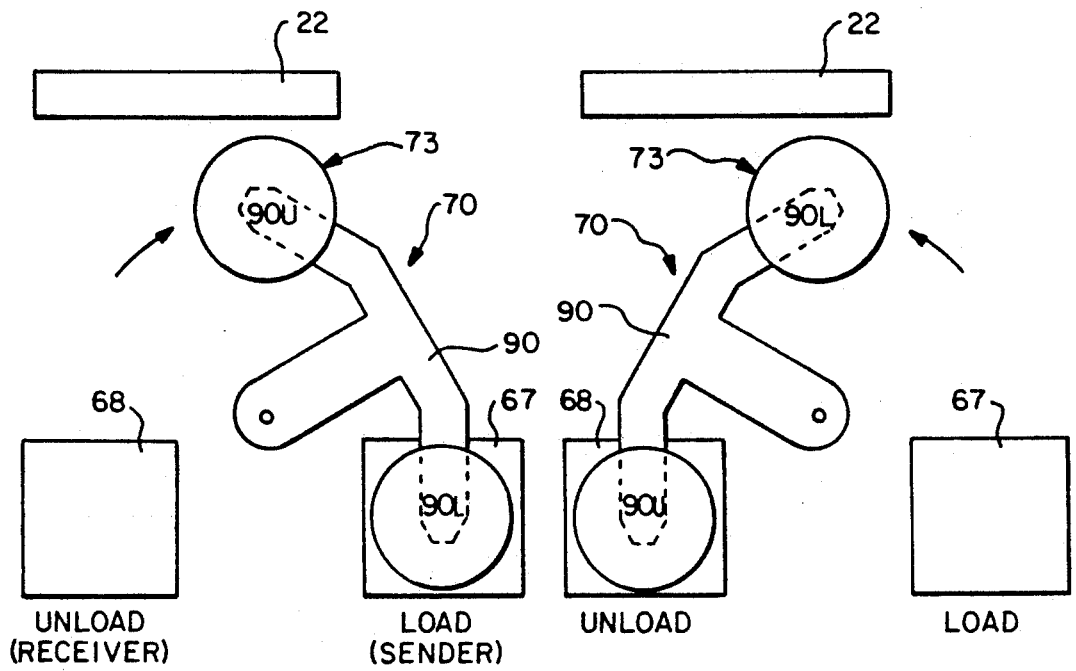
FIG.—12A  FIG.—12B
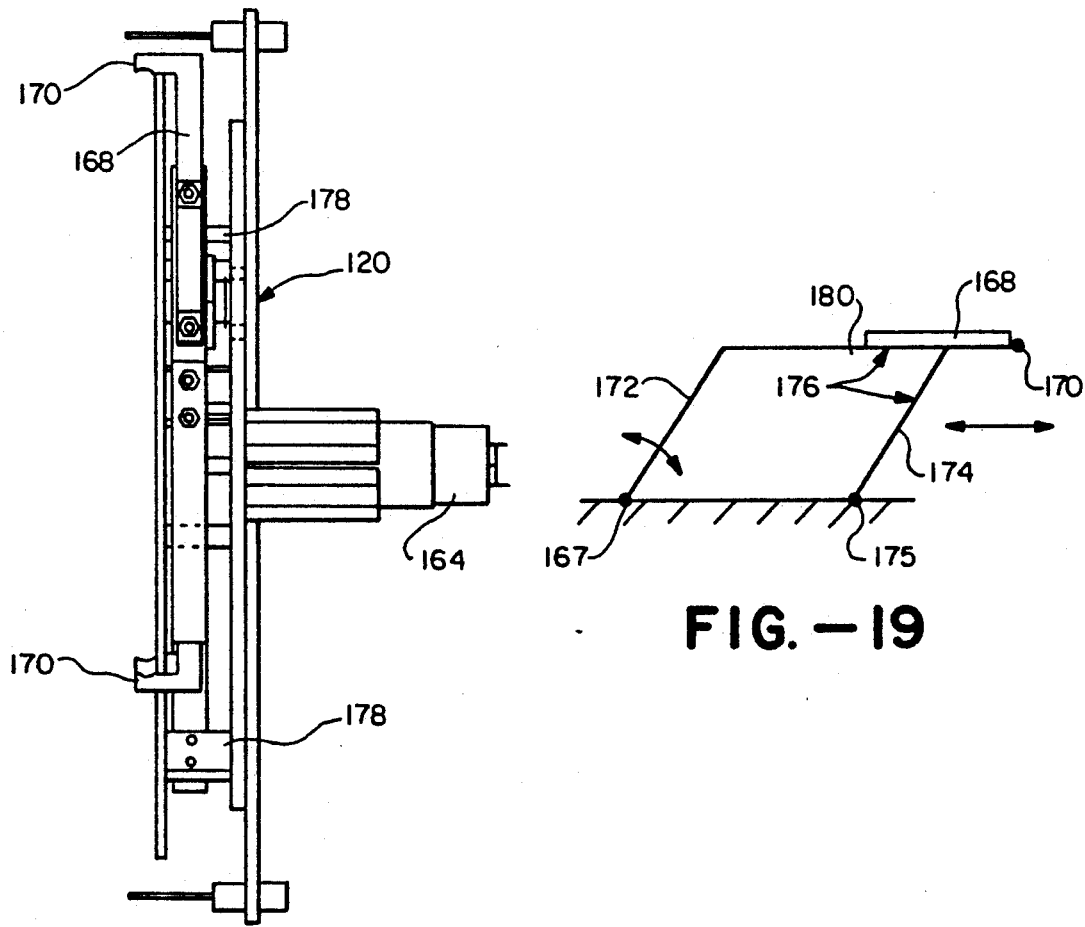
FIG.—18  FIG.—19

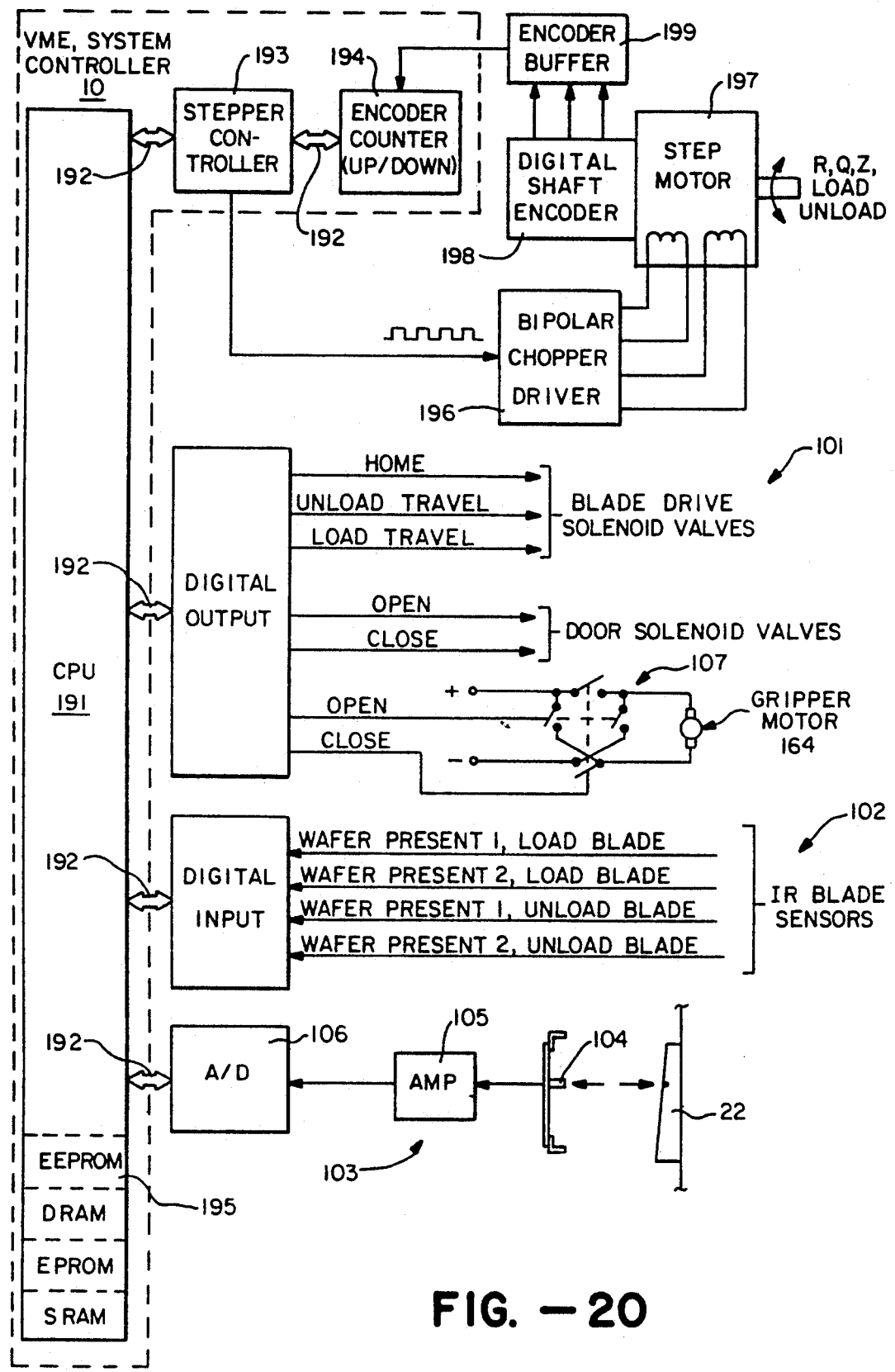
FIG. —20

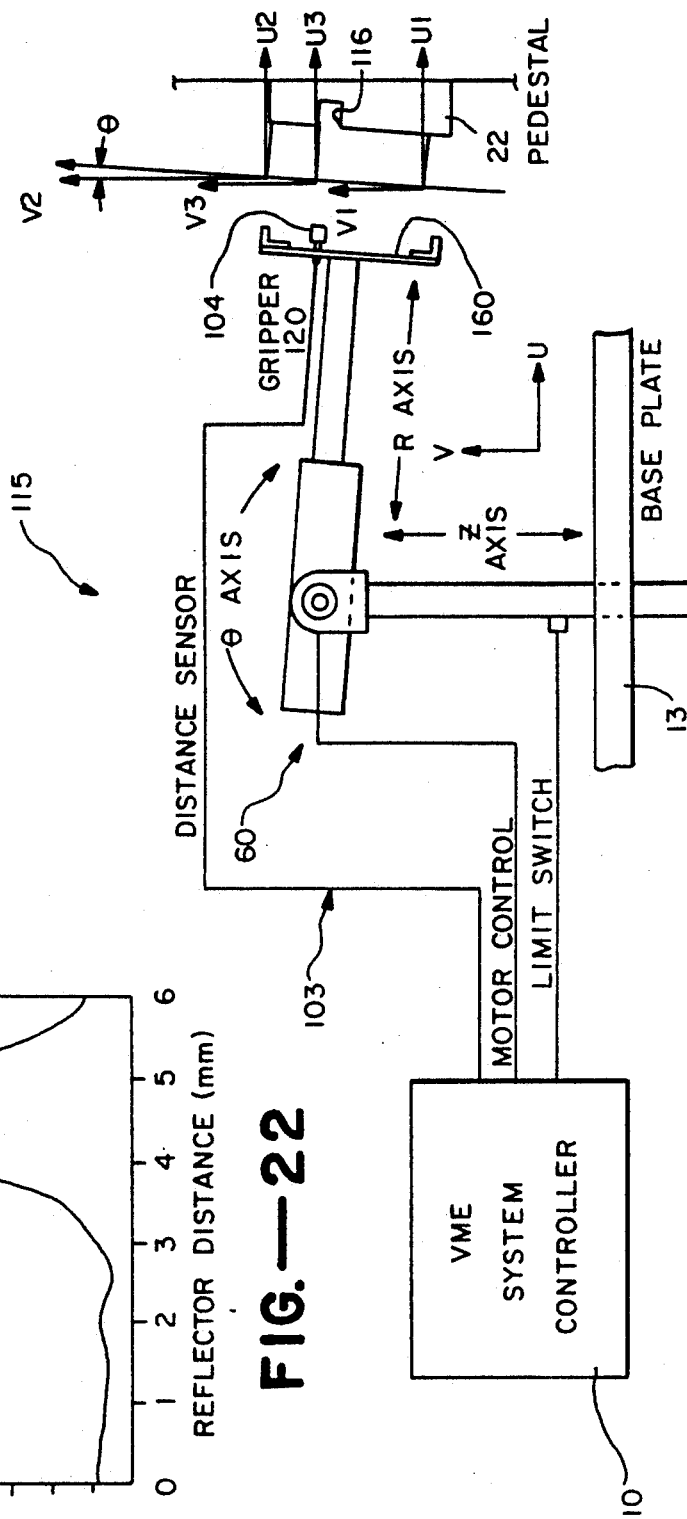

SEMICONDUCTOR PROCESSING SYSTEM WITH ROBOTIC AUTOLOADER AND LOAD LOCK

This is a continuation of U.S. application Ser. No. 07/789,761 filed Nov. 7, 1991, now abandoned; which is a continuation of U.S. Ser. No. 07/541,161 filed Jun. 18, 1990, now abandoned; which is a continuation of U.S. Ser. No. 07/246,761 filed Sep. 20, 1988, now U.S. Pat. No. 4,870,528; which is a division of U.S. Ser. No. 07/089,926 filed Aug. 25, 1987, now U.S. Pat. No. 4,911,597; which is a continuation of U.S. Ser. No. 06/693,722 filed Jan. 22, 1985, now abandoned.

BACKGROUND OF THE INVENTION

The present invention relates to apparatus and methods for processing semiconductor wafers and, in particular, to a semiconductor wafer etching system in which robotic wafer handling in a vacuum load lock provides rapid, contamination-free loading and unloading of the wafers.

In implementing the dense, complex and contamination-sensitive LSI and VLSI integrated circuit structures, it is desirable, for throughput and particulate control, to utilize a plasma etching technology which employs automatic, batch-type, cassette-to-cassette wafer handling, both for offloading wafers from a cassette onto a wafer support electrode within the processing chamber, and for returning the wafers to a cassette after processing. Throughput and particulate control would also be enhanced by the use of vacuum load lock mechanisms which provide wafer loading and offloading of the wafer support electrode in a vacuum. Load lock mechanisms not only decrease pumping and processing time, but also decrease exposure of the LSI/VLSI structures to contaminants.

Full optimization of throughput and contamination-free wafer handling also requires wafer handling systems which can precisely pick up and release wafers per se without damaging the wafers and without generating particulates from the wafers themselves. Additionally, throughput and cleanliness require wafer handling systems which have the capability to automatically load and unload a wafer support electrode, with a minimum intrusion of particulate-generating mechanisms into the processing chamber. The wafer support electrode typically is polygonal in cross-section and has as many as six or eight wafer-support faces or facets. Such "hexodes" or "octodes" or other multiple-facet electrodes permit a large number of wafers to be processed simultaneously but also impose stringent requirements in precisely positioning and picking up the wafers at a multiplicity of positions on the different faces of the electrode.

Considering first, robotic wafer handling per se, the two robotic-type wafer grippers which are believed to be conceptually the closest existing designs in terms of satisfying the above objectives, were developed in the same time frame as the present invention and, thus, very well may not be prior art. However, these systems are described here because they are the closest known existing designs. One of these wafer chucks is the subject of commonly assigned, co-pending Jacobs et al U.S. patent application, Ser. No. 591,439, filed Mar. 20, 1984, entitled "FINGER CHUCK AND METHOD FOR HANDLING ARTICLES", now abandoned. The Jacobs et al wafer gripper or chuck comprises a plurality of pivoted fingers which cooperatively grip and release a wafer by its edge. Each finger is mounted near the arcuate base of one leg of a U-shaped leaf-spring and extends past the base. The second leg of the spring is mounted to a flat mounting plate. In addition to mounting a wafer gripping finger, the end of the first leg is also mounted to a common base plate and forms a radial configuration with the other spring-mounted wafer gripping fingers. Reciprocal movement of this base plate, either directly by an electromagnetic field or by a solenoid-operated or air-operated plunger, pivots the wafer gripping fingers closed and open about the spring mounting for gripping and releasing a semiconductor wafer.

The second relevant wafer gripper is part of a wafer handling system which is available from Applied Materials, Inc., Santa Clara, Calif. The wafer gripper and associated wafer handling system are disclosed in commonly assigned Flint et al, U.S. Pat. No. 4,457,661, issued Jul. 3, 1984. The Flint et al wafer loading/unloading technique involves removing wafer holding covers or trays from a reactor electrode and mounting them on a generally cylindrical carousel for automatic loading/unloading of the wafers from the inside of the carousel, that is, from the backside of the trays. In particular, the Flint et al '661 patent covers apparatus for transferring wafers between the trays and a pair of load and unload cassettes which are positioned inside the carousel and trays. The wafers are held on the trays by leaf-spring-mounted clips. The clips are pivoted open by depressor pins mounted on the wafer gripper for inserting and releasing the wafers. The carousel is rotated about its axis to position successive trays for wafer loading and unloading by the gripper assembly. The wafer cassettes are positioned on an elevator assembly and can be indexed both axially (vertically) for alignment with different wafer holding positions on the trays, as well as radially (horizontally) for positioning the two cassettes over a pair of associated wafer transfer blades. The transfer blades transfer the wafers vertically between the cassettes and the associated gripper assembly, which comprises a pair of vacuum chucks. The chucks in turn carry the wafer horizontally between the transfer blades and the wafer holding positions on the trays.

An example of the wafer clips disclosed in the Flint et al '661 patent is shown in FIG. 4A and designated 1 here. Similar clips are disclosed in Dean et al U.S. Pat. No. 4,473,455. The clip depressors used by Flint et al are attached to the vacuum chucks and move with the chucks to engage the clips from the backside of the tray and wafer. The clip depressors (see depressor 2 in FIG. 4A) engage and pivot the clips 1 about their transverse mounting springs 3 in a generally forward and outward direction to open the clip array for gripping or releasing a wafer 4. This clip mounting and construction does not permit engagement from the front side. That is, engagement by the depressor pins 2 from the front side would merely pivot the clips 1 inwardly, closer together. This "closing" of the clip array would prevent loading a wafer 4 onto an empty tray position or, when a wafer is at the tray position, would result in the wafer being gripped even more tightly. In short, the clip construction and operation disclosed in the Flint et al '661 and in the Dean et al '455 patent are dedicated to backside loading/unloading of wafer trays, e.g., as described in the Flint et al patent itself, which necessarily involves loading/unloading at a distance from, rather than on, the reactor electrode.

Considering, next, wafer handling systems in general, several different types of approaches have been used for loading/unloading wafer support electrodes. One approach is to load and unload the hexode in the ambient atmosphere, either manually or using automated wafer handling. However, during atmosphere loading and unloading, the wafers and the processing chambers can be contaminated by particulates in the ambient atmosphere and by gases such as water vapor. In addition, this approach decreases throughput because the processing chamber vacuum is broken after each process sequence in order to unload and reload the wafers, and the chamber must then be pumped down to vacuum before starting the next processing sequence.

Another approach is to use a single-wafer processing chamber and load/unload the chamber from a load lock mechanism. This approach reduces contamination somewhat, but has the disadvantage of increased wafer handling time and reduced process quality or throughput.

Other approaches include loading multiple wafers on a planar electrode via a load lock mechanism, or onto a horizontally oriented electrode such as a hexode. However, to our knowledge none of the available load lock systems provides automatic, cassette-to-cassette wafer loading and unloading within the load lock onto a wafer-mounting electrode which is vertically oriented in its normal processing orientation. Loading and unloading a vertically oriented cathode is highly desirable because it reduces particulate contamination and allows a higher number of wafers per system floor space. The unavailability of such a system is, no doubt, due to the stringent wafer handling which are required of such a system.

In view of the above state-of-the-art, it is an object of the present invention to provide a robotic wafer handling system which provides automatic, batch-type cassette-to-cassette wafer loading and unloading of a plasma etching/processing chamber using a vacuum load lock.

It is another object to provide a robotic wafer handling system having the characteristics described in the preceding paragraph which loads and unloads a vertical wafer-mounting electrode.

It is yet another object of the present invention to provide a robotic wafer handling system having the characteristics described in the preceding two paragraphs and which meets very stringent particulate and contaminant requirements by virtue of the system design concept of (1) minimizing the generation of particulates and other contaminants by the constituent components or systems and (2) minimizing the transfer of contaminants between the various constituent systems/components.

SUMMARY OF THE INVENTION

In one aspect, the present invention comprises a semiconductor wafer handling system for loading and unloading a vacuum processing chamber which incorporates wafer support means, typically in the form of a vertical cylinder of polygonal horizontal cross-section. Each vertical wall or face of the wafer support is adapted for releasably holding a plurality of wafers. A vacuum load lock mechanism is mounted adjacent the processing chamber. A retractable gate valve between the wafer processing chamber and the load lock encloses the vacuum processing chamber and opens to permit the transfer of the wafers between the chamber and load lock.

In particular, the wafer handling system includes a wafer indexer, a shuttle blade and a robotic wafer transfer system or robot. These key components are all located within the load lock. The indexer, shuttle and robot cooperatively unload the wafers from containers such as cassettes onto the wafer support (hereafter "hexode") and offload the wafers from the hexode and return the wafers to the cassettes.

Four transfer stations or positions are used for this cooperative reciprocal wafer transfer process. The wafer indexers mount separate containers, such as cassettes—one cassette holds unprocessed wafers and the other receives processed wafers—and indexes the cassettes past respective cassette unloading and reloading stations.

The shuttle reciprocally transfers wafers between the unloading/reloading stations and an intermediate third station where the wafers are picked up/deposited by the robot. The robot is adapted for Z translational movement and $\theta$ rotational movement about the center defined by the Z position and R translational motion from the center defined by Z along the direction defined by $\theta$, for transferring the wafers between the horizontal third station and the vertical fourth station at the hexode, where the robot deposits the wafers or removes the wafers.

In one particular aspect, the shuttle blade is a two-pronged blade which is mounted for generally horizontal pivotal movement to position the blade ends at the first and third or second and third stations. Pivotal movement in one direction (e.g., clockwise CW) positions one blade in the loading cassette (first station) for removing a wafer from the cassette when the cassette is indexed down one position by the indexer, while the second blade is positioned at the third station for receiving a wafer which has been off-loaded by the robot from the hexode. Conversely, pivotal movement in the opposite direction (e.g., counter-clockwise, CCW) now pivots the off-loaded processed wafer into the receiving cassette at the unload station (second station) such that indexing of the cassette up one position lifts the processed wafer off the second blade. The CCW movement simultaneously presents the first blade and unprocessed wafer to the third station for pick-up by the robot.

As alluded to above, when an unprocessed wafer is presented to the third station, the robot extends towards and engages the horizontal wafer, retracts, pivots it vertically then moves in the R and Z directions to position the wafer at a selected wafer position at the hexode, then releases the wafer onto the hexode. The robot is then selectively indexed vertically in the Z direction into position for engaging and off-loading a processed wafer from the wafer holder, pivots to orient the wafer horizontally and translates in the R direction to position the processed wafer at the third position, then releases the processed wafer onto the shuttle second blade for insertion into the unload cassette.

In another aspect, the present invention comprises a robotic wafer handling system for transferring wafers tridirectionally (R$\theta$Z plane) between the third and fourth angularly oriented positions. The system comprises a wafer gripper or head having a plurality of gripping fingers which are actuable for releasably gripping a wafer by its edge. Means are provided for pivoting the head between the third and fourth angularly oriented positions or stations and for orienting the head for loading and unloading the wafers at each of these positions. In addition, R$\theta$Z head transfer apparatus means is provided for moving the head between the third and fourth, angularly oriented positions for transferring wafers between the hexode and the shuttle.

In still another aspect, the present invention comprises a chuck or head for releasably picking up articles such as semiconductor wafers, which includes (1) a base; (2) a hub which is rotatably mounted on the base; (3) a plurality of first arms mounted on the hub for rotation on the base substantially transverse to their length; and (4) a plurality of second arms, each of which is attached to the base at one point and to a first arm at a second, spaced point, for converting reciprocal rotation of the hub into substantially radial inward and outward translational movement of the first arm for cooperatively picking up and releasing the objects.

The present system allows processing of wafers on a vertically oriented cathode with a selection between gravity hold and wafer clamping to provide the thermal connection between the wafer and the cathode. Both gravity hold and wafer clamping are provided in conjunction with automatic, in-vacuum, low particulate wafer handling. In another aspect of the invention, the above-mentioned wafer clamping function is provided by an improvement of the clips disclosed in the Flint '661 patent. The present wafer-holding clips are designed to be actuated by clip depressors from the front or processing side of the electrode/hexode covers, consistent with the object of performing wafer loading/unloading with the covers mounted on, rather than removed from, the electrode.

The design of the robotic, in-vacuum wafer loading and unloading system and components decreases the intrusion of particulate-generating moving mechanisms into the processing chamber and thereby minimizes contamination of the wafers and the chamber environment. Particulates are minimized by a load lock chamber filter system, which includes a robot housing filter which prevents the transfer of particles between the robot and the surrounding load lock chamber. This filter system also includes a vent inlet line filter and a roughing outlet/exhaust line filter which isolate the load lock chamber from the vent gas supply and the roughing vacuum system and, together with the use of a sequenced venting and roughing approach, establish non-turbulent, laminar, particulate-free fluid flow during venting and roughing.

The robotic wafer handling combined with the load lock allows batch processing of wafers in a process chamber which is kept continually at vacuum to exclude the ambient atmosphere—including contaminants, particulates and water vapor—from the process chamber.

The above-described system also combines the advantages of a load lock with those of an automatic wafer handling system and a vertically oriented batch plasma etching process.

In still another aspect, the unique thermally-isolated mounting of the robotics to the processing chamber subframe minimizes thermal stress and strain on the robotic wafer handling system, yet maintains alignment of the system relative to the processing chamber and pedestals and thereby provides stable positioning of the wafer handling system despite different thermal conditions in different parts of the overall system.

The present system uses an electronic memory map of electrode pedestal position and orientation data, derived from an optical sensor on the robot, to effect the precise autoloading and unloading of wafers at the pedestals.

The features described above cooperatively provide low contamination, fast, automatic, large volume, cassette-to-cassette batch wafer handling which is ideally suited for high throughput, fine geometry VLSI wafer processing technology.

BRIEF DESCRIPTION OF THE DRAWINGS

The above and other advantages of the present invention are described in conjunction with the following drawing figures, in which:

FIG. 8 is an end view of the load indexer of FIG. 7;

FIG. 9A is a top plan view of the shuttle blade mechanism;

FIG. 9B is a section view taken along line 9B—9B in FIG. 9;

FIGS. 12A and 12B schematically depict operational views of the shuttle blade;

FIG. 18 is a side elevational view of the wafer gripper showing the clip depressors;

FIG. 19 is a schematic representation of the four-bar link construction of the wafer gripper;

FIG. 20 is a block diagram of the autoloader control system;

FIG. 21 is a block diagram which schematically depicts the gripper controller and memory mapping system (autoaligner); and FIG. 22 is a graph of the reflected photocurrent characteristics associated with the sensor of FIG. 22.

DETAILED DESCRIPTION OF THE INVENTION

Figure 1:
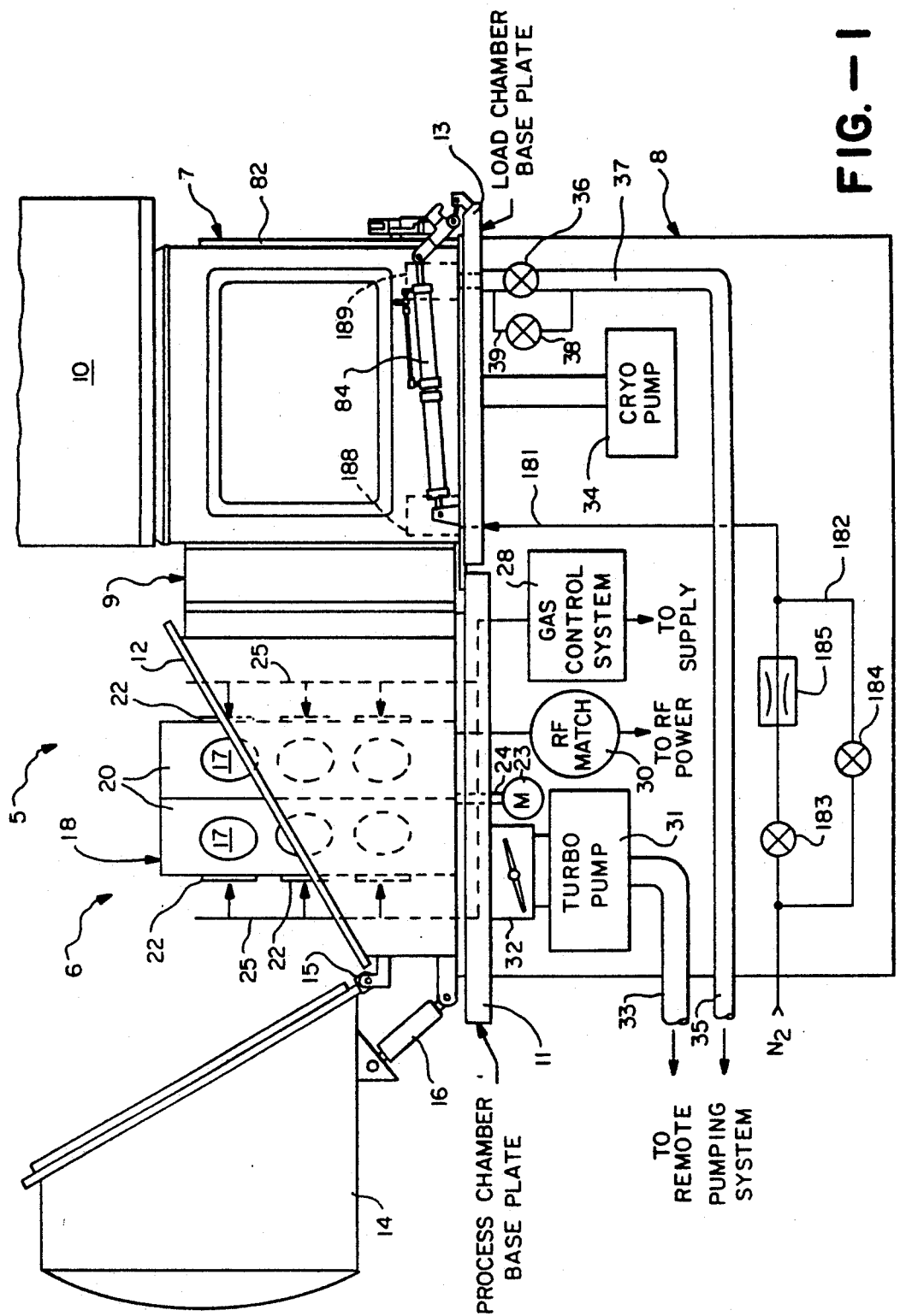
FIG. 1 is a side elevational view of the present semiconductor processing system, shown partly in section and schematically.

FIG. 1 illustrates a preferred embodiment of the present invention in the form of a semiconductor processing system 5. The illustrated system is a plasma etcher which includes a vacuum processing chamber 6 and a vacuum load lock chamber 7, both of which are mounted on frame 8. The automated wafer loader (loading and unloading) system of the present invention is contained within the load lock chamber 7. Access between the wafer processing chamber 6 and the load lock chamber 7 is provided by a conventional gate valve assembly 9. The gate valve forms an opening between the two chambers and contains a retractable door (not shown) which, when extended, seals the opening between the vacuum processing chamber 6 and the load lock chamber 7 and, when retracted, provides access by the load lock wafer handling system to a wafer-holding hexode 18 within chamber 6. The wafer etching system 5 may also include a microprocessor control system, display screen and keyboard, designated collectively by the reference numeral 10, which can be used to control the operation of the various sytems and components.

Plasma Chamber Construction and Operation

Referring further to FIG. 1, the processing chamber 6 which is the subject of the present invention is a radio frequency (RF) plasma etching chamber. The chamber 6 is mounted on a process chamber base plate 11. The chamber 6 comprises a cover assembly which includes a fixed base 12 and a cover 14 which is pivotally mounted at 15 and is opened and closed by a pneumatic cylinder 16. Integrated circuit wafers 17 are supported in the chamber 6 for processing on a vertical cylindrical electrode 18 which typically has a polygonal horizontal cross-section. The illustrated hexagonal electrode or "hexode" 18 comprises six removable, generally vertical, aluminum oxide-coated aluminum faces or covers 20—20, each of which has three bores 21—21 in which are mounted wafer support pedestals 22—22. See FIGS. 2 and 3. The hexode 18 is mounted for rotation about a vertical axis within the chamber. An electric motor 23 is mounted within the base compartment 8 and has an indexing assembly 24 which is coupled into the chamber 6 by a conventional vacuum rotational seal (not shown) and is connected to the base of the hexode for rotating the hexode. The processing chamber base and cover and the other major structural components of the RF wafer processing system 5 are aluminum or stainless steel. The base 12, cover 14, retractable door, and process chamber base plate 11 form the anode in the RF processing system.

Figure 5:
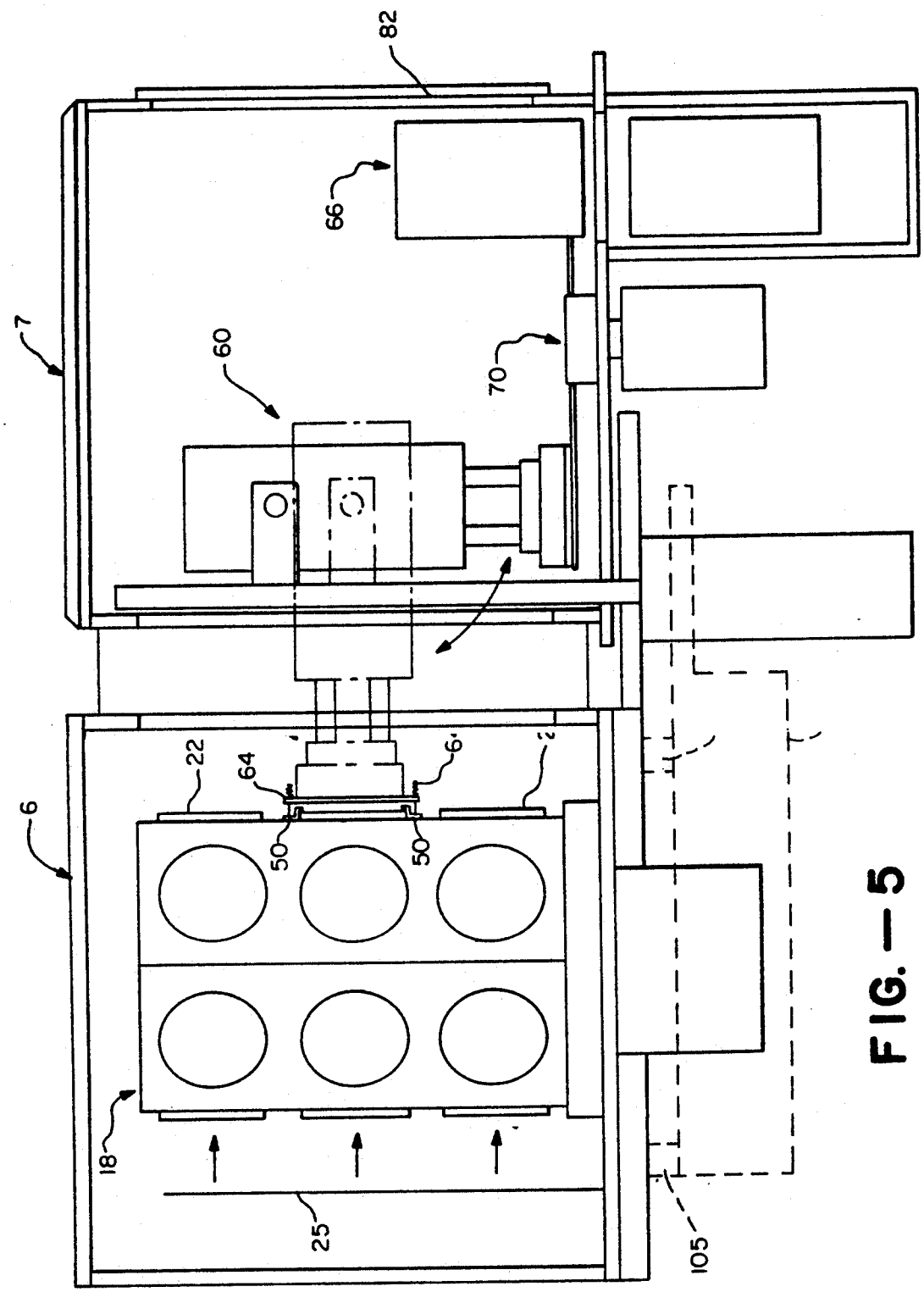
FIG. 5 is a slightly enlarged depiction of the overall semiconductor processing system, similar to FIG. 1, emphasizing different features of the system.

As shown schematically in FIGS. 1 and 5, gas inlet tubes 25—25 are mounted adjacent each hexode face or cover 20 for supplying etching gas to the chamber 6. The purpose is to develop an etching plasma in the chamber RF field which is applied between the cathode 18 and the chamber wall/anode 12,14. Reactant gas is applied to the inlet tubes and the chamber from a gas supply system which includes a number of gas storage tanks or reservoirs (not shown) which supply gases through gas control system 28 to the inlet tubes 25—25. The control system 28 may be composed of a plurality of mass flow controllers. Power is supplied for creating an etching plasma from the reactant gases by an RF system, which includes a remote RF generator and a load matching network 30, and which is connected to the hexode 18. A turbomolecular pump 31 connects chamber exhaust 32 to a remote pumping system (not shown) via exhaust line 33 for evacuating the processing chamber 6 to subatmospheric pressure. Also, vacuum is applied to the load lock chamber 7 by a cryo pump 34 and a remote roughing pump which is connected to exhaust line 35.

The roughing system includes valve 36 in regular roughing line 37 and valve 38 in bypass/slow roughing line 39. These two valves are used to select between high flow rate regular roughing over line 37 (valve 36 open; 38 closed) and relatively low flow rate, slow roughing over the smaller diameter slow roughing line 39 (valve 38 open; 36 closed).

Figure 2:
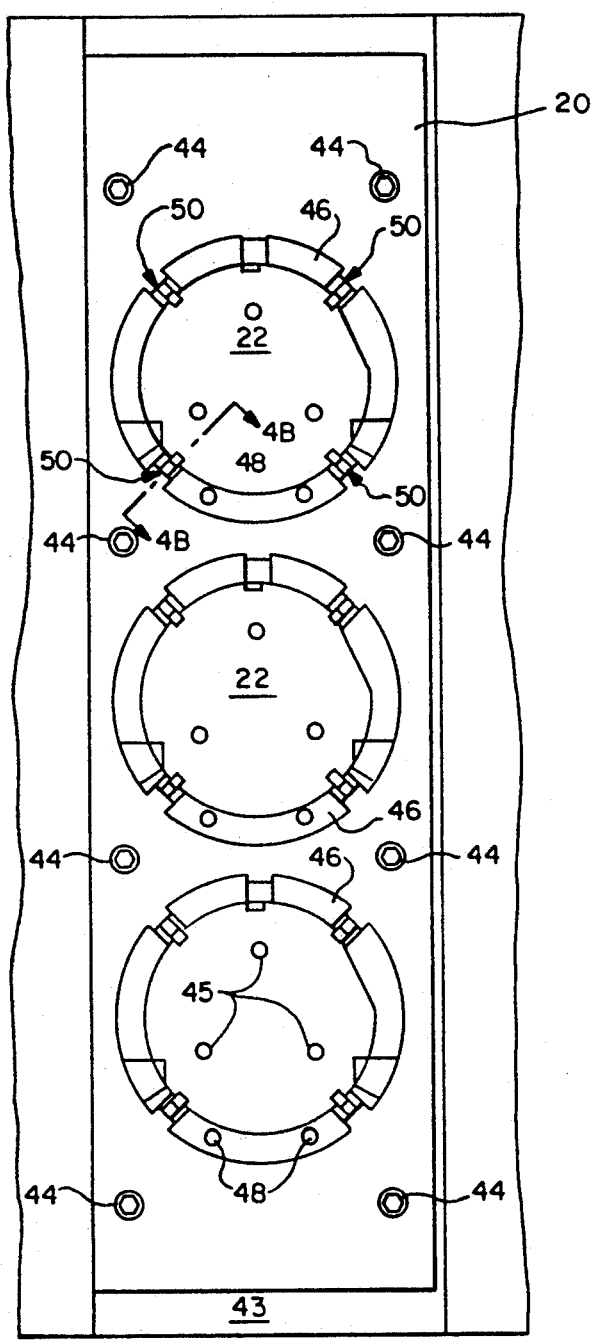
FIGS. 2 and 3 are, respectively, front elevation and vertical cross-section views of a hexode cover which includes the wafer gripping clips of the present invention.
Figure 3:
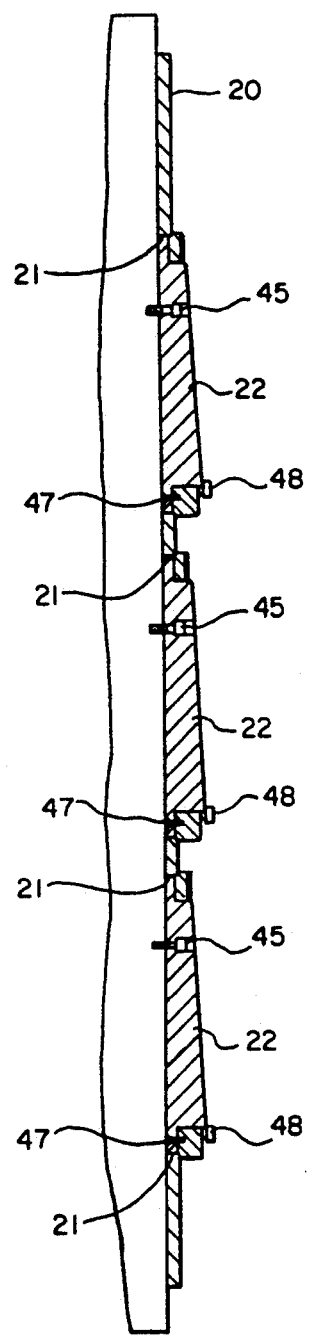

An enlarged view of an individual hexode face or slab 20 utilizing clamp means is shown in FIGS. 2 and 3. The individual hexode faces or slabs 20 are removably mounted on a hexode frame 43 by screws 44—44, thereby interconnecting the faces electrically. Interchangeable pedestals 22—22 of different sizes and/or materials can be mounted within the bores 21 by screws 45—45 and used for processing wafers 17 (FIG. 1) of different diameters. Each pedestal 22 is mounted to the hexode at a slight angle from the vertical, approximately 3°. Pedestal rings 46—46 are mounted by screws 47—47 to the pedestals 22—22. A pair of wafer support buttons 48—48 are mounted on the bottom section of each pedestal ring so that the wafers are retained on the pedestal by gravity.

In etching material such as aluminum, the gravity-induced contact between the wafer 17 and the inclined pedestal 22 provides adequate heat transfer to uniformly cool the wafer and prevent thermal-induced effects. The greater amounts of heat produced by processes such as oxide etching may require more forceful, uniform pedestal-to-wafer contact for adequate thermal conduction and wafer cooling. That is, some form of external clamping must be used. This thermal transfer clamping function must be provided consistent with the object of totally automated, in vacuum wafer handling.

Wafer Clips

Figures 4A, 4B:
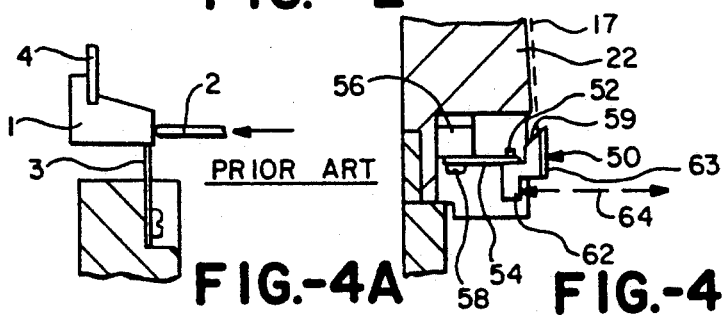
FIG. 4A is an enlarged fragmentary section view of a prior art wafer holding clip.
FIGS. 4B and 4C are enlarged fragmentary sectional views taken along the lines 4—4 in FIG. 2 illustrating the construction and operation of the wafer-holding clip of the present invention.
Figure 4C:
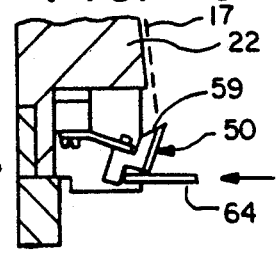

Referring to FIGS. 2, 4B and 4C, the above objective is satisfied by the use of wafer clips 50—50 which provide the necessary contact pressure, yet automatically release from the wafer to permit loading and unloading of the pedestal by the system wafer handling robot with a minimum of particulate generation. In the preferred arrangement shown in FIG. 2, the support buttons 48—48 are used to hold the wafer during the time when the robot is releasing wafers 17 onto the pedestal or picking up wafers from the pedestal front or processing side of the wafer cover 20. See also FIG. 5. At other times, the wafers 17 are secured to the pedestal by the plurality of clips 50—50, (typically four per pedestal). Each clip 50 is mounted by a screw 52 to a flat spring 54 which in turn is mounted to a support block 56 on the pedestal by a screw 58. The spring 54 extends generally transverse (~90°) to the plane of the cover 20. Due to this mounting arrangement, the spring 54 and clip 50 pivot at or adjacent the spring mounting point 58 and the clips are normally biased by the springs to uniformly clamp the wafer 17 against the pedestal, as illustrated schematically in FIG. 4B.

The illustrated embodiment uses four clips 50 which are individually pivoted outward by the arms 64—64 of the wafer handling robot 60, as shown in FIG. 4C, to permit the robot to release the wafer to the pedestal 22 for engagement by the clips and to permit the robot to engage and remove the wafers from the pedestal. The illustrated "Z" clip configuration provided by the actuating arm 62 and the clip-engaging arm 63 and the clip dimensions are selected to minimize particulates created by robot actuation: the angled, approximately 45° flat front surface 59 contacts and holds the wafer in place without undue stress; and the actuating step or arm 62 is positioned close to the pivot point 58 of the clip to minimize the angle between the clip and the robot actuator arm 64 as well as the distance traveled by the robot and the clip step in rotating the clip. These features minimize particulates caused by contact between the arm 64 and the step 62. In addition, the flat spring 54 pivots without surface contact and is designed to securely clamp the wafer to the pedestal over the entire wafer surface without damaging the wafer and using a stress which is only about 60–65 percent of the spring's yield strength. In the illustrated embodiment, the desired stress level is provided by a spring which is about 0.5 inches long ×0.2 inches wide×0.004 inches thick, and is rotated a maximum of about 30° between loading and unloading. As a consequence of these features, the robot actuator clip 50 operates with a controlled, uniform low clamping force without damage to the wafer or its coatings and is activated from the front side of the cover 20 by the robot to engage and release the wafer with the cover in situ on the hexode 18 and with a minimum of particulate generation. The clip is also transparent to the magnetic field and therefore does not interfere with the uniform plasma generation. Those of skill in the art will readily vary the number and orientation of the clips to accommodate different requirements.

Automatic Wafer Handling System

Referring to the schematic, partial left side elevational illustration of the system 5 shown in FIG. 5, the wafer handling system or "autoloader" is enclosed within the vacuum load lock chamber 7. The loader includes an indexer system 66 which includes a two-cassette capacity unloading indexer 68 (FIG. 7), a two-cassette capacity loading indexer 67 (FIG. 6), shuttle or wafer transfer mechanism 70 (FIGS. 9–11), flat finding mechanism 71 (within the reloading indexer, see FIG. 7) and the four-axis wafer transfer robot 60 (FIGS. 5 and 12-19). The indexers 67-68 of indexer system 66 are each mounted on the interior side of individual vacuum doors 82—82 which are pivoted opened and closed by pneumatic/hydraulic cylinders 84—84. See FIG. 1. When closed, the doors form part of the wall of the vacuum chamber 7.

With the vacuum doors 82—82 open, the standard wafer cassettes 72 in the horizontal indexers 67 and 68 are unloaded and new cassettes 72 are loaded onto the indexers (empty cassettes in unload indexer 68, FIG. 7; cassettes with wafers to be etched in load indexer 67, FIG. 6), with the wafers in a vertical orientation. The flat finding mechanism 71 is a conventional roller mechanism 74 which is mounted beneath the load cassette and connected by coupling 75 to drive motor 76 for rotating the wafers within the conventional open-bottom cassette so that the flats are at the bottom dead center (BDC) location.

After the flats are oriented, the indexer 82—82 doors are pivoted shut vertically by the cylinder assemblies 84—84 so that the wafers in their cassettes are rotated to a horizontal orientation for loading and so that the vacuum chamber is sealed. The wafers 17 in the loading indexer 67 are sequentially removed by the wafer shuttle 70 and brought individually to a transfer station 73 (FIG. 12A) beneath the four-axis robot 60. The robot picks up a wafer from the shuttle 70 at the station 73 and places it in a selected one of the three cathode pedestal locations 22A–22C (FIG. 5) on the hexode face 20 facing the robot. Robot 60 also sequentially removes wafers from the cathode and places them on the shuttle at the station 73 (FIG. 12B) for transfer by the shuttle to the unloading indexer 68. Thus, at the start of operation, i.e., with an empty hexode 18, the robot 60 loads wafers from the load cassette 67 onto the pedestals 22. After a previous processing sequence, the robot unloads then loads each pedestal position before moving on to the next pedestal position and, then, the next hexode face. The wafers are handled by their backside and edges in such a manner, described below, that the wafer edge contact forces are limited to about eight ounces, causing no damage to the resist bead that is often present at the edge of the wafer. Also, the wafers are handled in vacuum only.

Indexing System

As mentioned, the indexing system 66 includes a two-cassette capacity load indexer 67 and a two-cassette capacity unload indexer 68 which are indexed to position the respective cassettes at a respective loading position (also designated 67) and unloading position (also designated 68) for off-loading and loading of the cassettes by the wafer.

Figure 6:
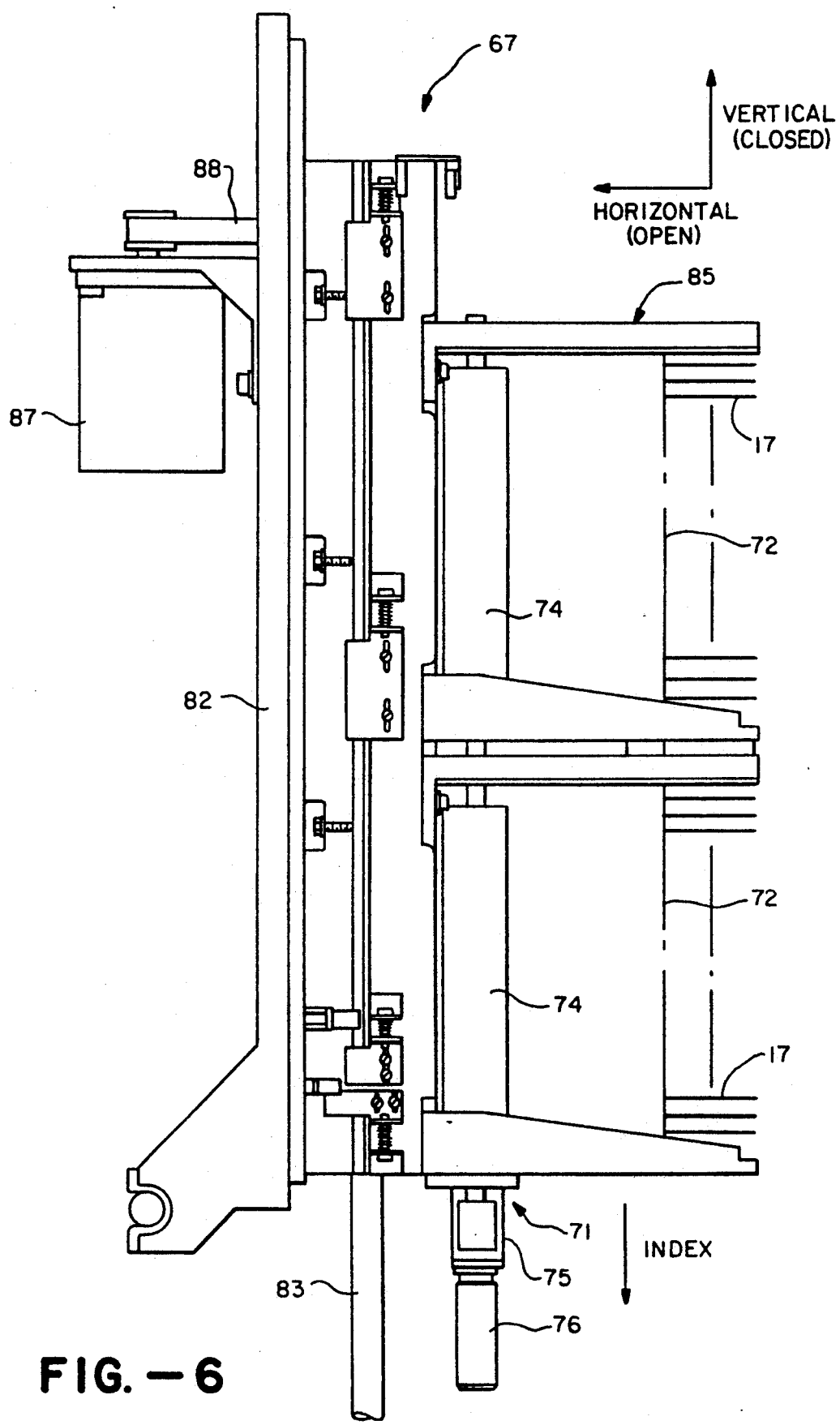
FIGS. 6 and 7 are, respectively, a right-side elevational view and a left-side elevational view of the load cassette indexing mechanism and the unload cassette indexing mechanism.
Figure 7:
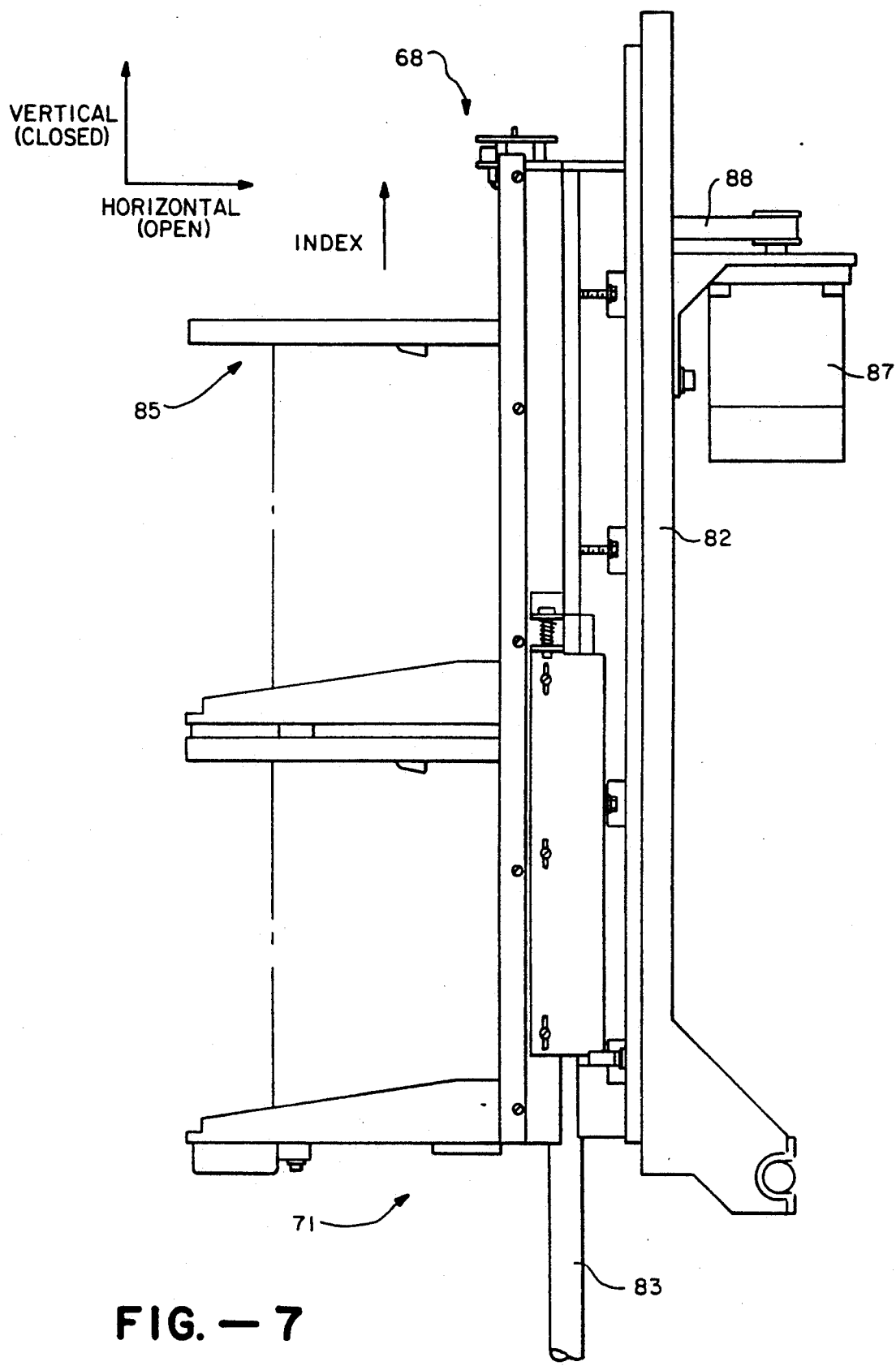

Referring specifically to FIGS. 6–8, each indexer 67-68 includes a pair of guide rails 83—83 which are mounted to the associated load lock door 82. The doors 82—82 are opened and closed by pneumatic/hydraulic cylinders 84 (FIG. 1). The doors 82 provide access to the load lock chamber 7 and also mount the cassettes 72 for vertical indexing past the respective loading/unloading positions. The cassettes 72 are standard multiple wafer cassettes and are supported on conventional dual cassette mounting fixtures 85. Each fixture is slidably mounted on the pair of guide rails 83—83 and mounts, and is indexed by, a conventional power screw drive 86 (FIG. 8) which is driven by an associated stepper motor 87 operating via a drive belt 88. When the doors 82—82 are pivoted to the open, approximately horizontal orientation by the cylinder 84, the existing cassettes are unloaded from the indexers, and load indexer 67 is loaded with cassettes containing wafers which are to be processed, while unload indexer 68 is loaded with empty cassettes. When the load lock doors 82—82 are pivoted closed by the cylinders 84—84, the doors become part of the vacuum tight load lock chamber wall 7 and also position the cassette indexing system for vertical indexing of the cassettes by the stepper motors 87 to position the horizontal wafers in seriatim at the loading position 67 and to position the horizontal receiving cassettes at the cassette load position 68.

Shuttle

Figure 10:
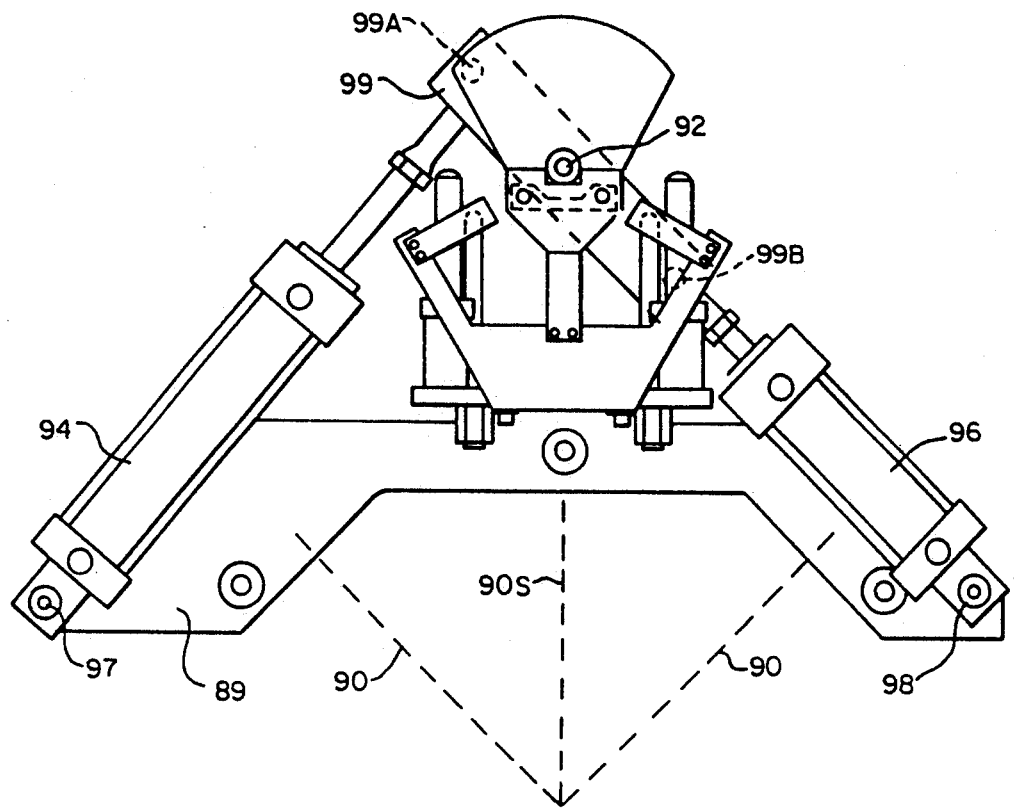
FIGS. 10 and 11 are, respectively, a bottom plan view and an end view of the shuttle blade mechanism of FIG. 9.
Figure 11:
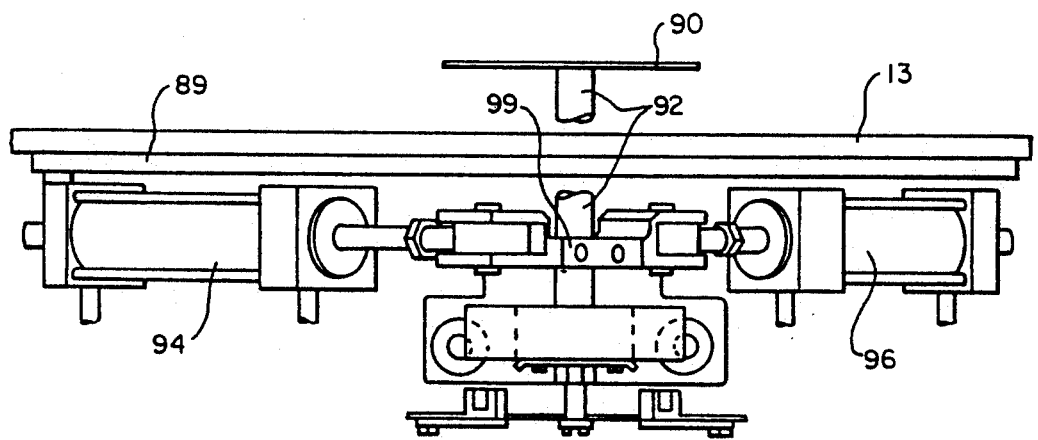

Referring to FIGS. 9A–12B, the wafer transfer mechanism or shuttle 70 comprises a base 89 which is bolted to the load chamber base plate 13 (FIG. 1). A generally T-shaped, dual ended blade 90 is mounted to the base 89 for approximately 90° reversible rotation between the load position 67, the robot transfer position 73 and the load position 68, and vice versa. The T-shaped blade 90, shown most clearly in FIGS. 9A and 9B, includes an unload end 90U and a load end 90L. The arm 90S of the angled blade is mounted for reciprocal pivotal rotation on an air cylinder-operated shaft 92. As shown in FIGS. 10 and 11, a pair of air cylinders 94 and 96 are pivotally mounted on the frame 89 at 97 and 98 and are coupled to the shaft 92 by crank arm 99 at 99A and 99B, respectively, for pivoting it. Cylinder 94 is a travel cylinder which pivots the shaft 92 and blade 90 between the cassette unload and reload positions 67 and 68. Air cylinder 96 is a "home" cylinder which returns the blade 90 to an intermediate, center position when the travel cylinder is released between transfer operations. Cam 91 is fixedly mounted on base 88. A pair of cam followers 101—101 are mounted one on each blade 90U, 90R, at 102—102. Each cam follower mounts a roller 104. The cam 91 is configured so that during pivotal movement of the blades, the rollers 104 cause the blade ends 90U or 90R to describe a generally curved path, with a transition to a substantially straight path during entry into and retraction from the cassettes. This path 100U, 100R facilitates accurate removal and insertion of the wafers from and to the cassettes without damage.

Referring further to FIGS. 9A, 12A and 12B, and in particular 12A, clockwise pivoting of the transfer blade 90 positions load end 90L at the load position 67 preparatory to picking up an unprocessed wafer from the load cassette, while the second, empty unload end 90U is positioned at transfer position 73 to receive from the robot 60 a wafer which has been off-loaded from hexode 18. As shown particularly in FIG. 12B, counterclockwise pivoting of the blade 90 positions the unload end 90U at the reload position 68 for transferring the off-loaded wafer to the "finished processing" or unload cassette and positions the unprocessed wafer on the load end 90L at position 73 for transfer to the robot 60 for loading onto the hexode 18.

Robotic Wafer Gripper 60

Figures 13, 14:
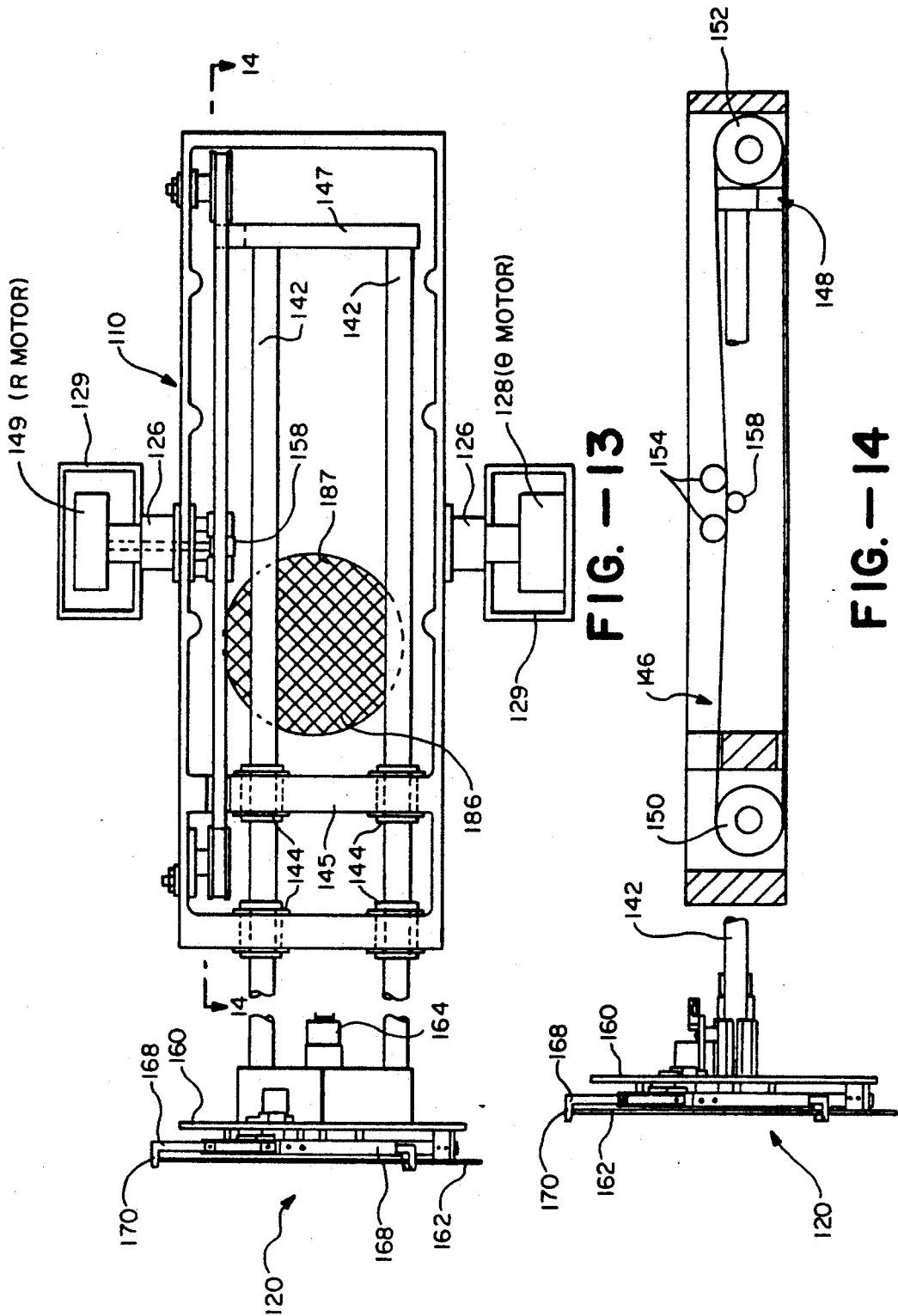
FIG. 13 is a top plan view of the robot shown with the housing cover removed.
FIG. 14 is a sectional view taken along line 14—14 in FIG. 12.
Figures 15A, 15B:
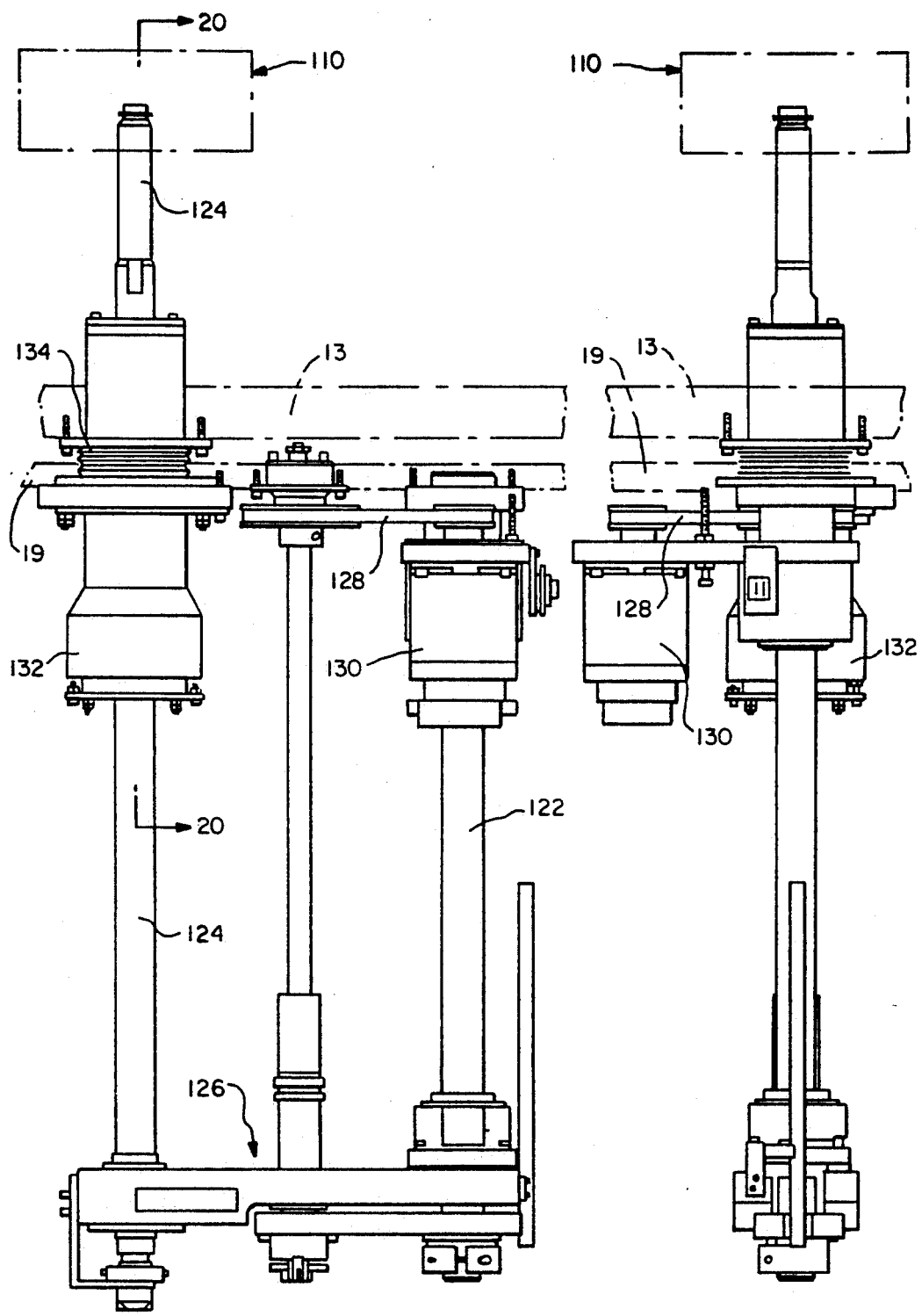
FIGS. 15A and 15B are orthogonal elevational views of the robot elevator assembly.

Referring to FIGS. 13 and 14, the four-axis robot 60 includes a housing or enclosure 110 which mounts a wafer gripper head or chuck 120. As shown in FIGS. 15A and 15B, the housing 110 is supported for vertical or Z-axis movement by an elevator shaft 124 and guided during rotation by shaft 122. Guide shaft 122 is fixedly mounted to the process system subframe 19 (FIG. 5). The elevator shaft 124 is coupled to the fixed guide shaft by a conventional power screw drive mechanism 126 which is also mounted to the subframe 19 and actuated by a belt 128 driven by motor 130 for moving the shaft 124 vertically up and down. The movable shaft 124 extends through a ball bushing pair in ball bushing housing 132 mounted to the subframe and a bellows seal 134 mounted between the housing 132 and the load chamber base plate 13 of the load lock chamber 7. Controlled reciprocal vertical movement of the movable shaft 124 moves the attached robot 60 and gripper head 120 between the three pedestal off-loading/loading positions 22A, 22B, 22C associated with each pedestal face 20. See FIG. 5.

Referring again to FIGS. 13 and 14, the timing belt housing 110 is pivotally mounted on horizontal shaft 126—126. Pivotal ($\theta$) movement of the housing 110 about the shaft 126 is effected by a stepper motor and harmonic drive speed reducer 128, which is mounted to a mounting bracket assembly 129 affixed to elevator shaft 124 (FIG. 15A). Actuation of the reversible $\theta$ motor 128 rotates the housing and wafer gripper head approximately 90° counterclockwise (FIG. 5) to move the gripper from the vertical pedestal positions 22 into angular alignment with the horizontal position 73 to off-load a wafer from the pedestal onto the shuttle 70. Clockwise rotation moves the gripper from alignment with the transfer position 73 into vertical alignment with the pedestal positions 22 to transfer a wafer from the blade to the pedestal.

Referring further to FIGS. 13 and 14, the wafer gripper head 120 is mounted at one end of a pair of support rods 142—142 which are slidably supported by four linear ball bushings 144—144, two each in one end of the housing 110 and in housing frame member 145. The support rod assembly is attached to a belt drive 146 at 148. The toothed belt 146 is mounted over idler pulleys 150, 152, passes beneath pinch rollers 154—154 and is reversibly driven by a cog wheel 158 which is driven by motor 149. The belt 146 is also attached to support bar 147 for the rods 142—142, at 148. Thus, reversible rotation of the R motor 149 advances the rods 142 and head 120 to pick up or unload a wafer 17 at the selected pedestal position 22A-C or transfer position 73, then retracts the head preparatory to rotation and transfer to the transfer position 73 pedestal position 22A-C.

Figure 16:
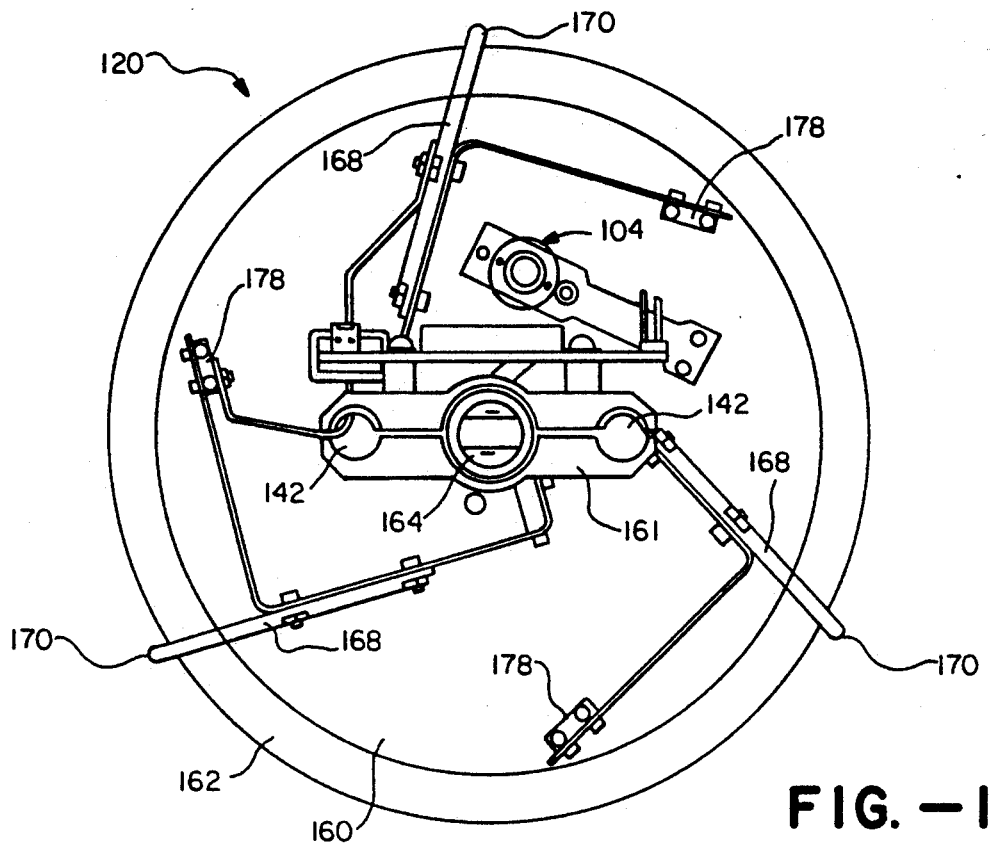
FIG. 16 is a rear elevational view of the wafer gripper.
Figure 17:
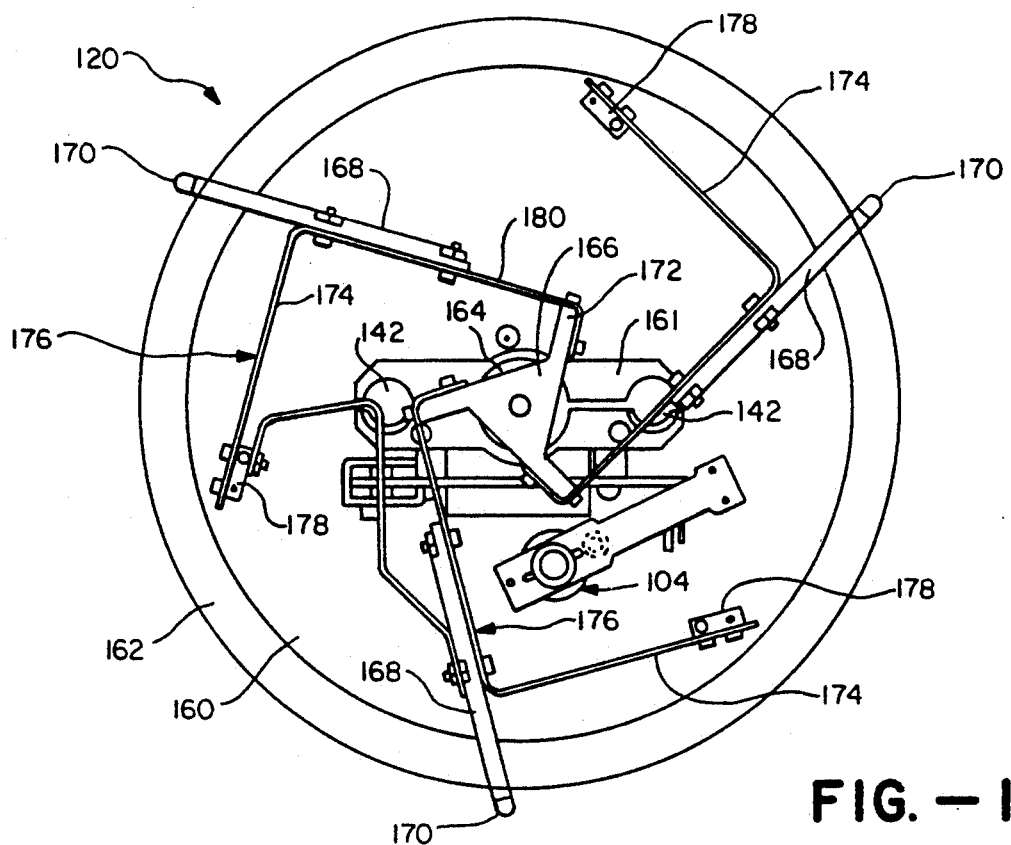
FIG. 17 is a front elevational view of the wafer gripper.

Referring to FIGS. 16-18, as well as FIGS. 13 and 14, the wafer gripper head 120 itself includes, a transparent circular base 160 which is attached to the front end of the support shafts 142 by coupling/collar 161. A front cover 162 is attached to the base 160 by means of mounting blocks 178—178 which also attach gripping arms 168 to the base 120. A gear reduction electric motor 164 is mounted to the rear of the base so that its drive shaft extends through the base 160 (FIG. 17). A hub 166 is mounted on the shaft and has a plurality of gripping arms 168—168 extending therefrom parallel to the base. Each arm 168 has a wafer gripper finger 170 which extends transversely from the end of the arm typically at about a 90° angle relative to the arm, past the front of the base. The gripper arms 168 are connected to the hub 166 and the hub is connected to the motor drive shaft as part of a four-bar link arrangement which converts rotation of the shaft and the hub 166 into substantially linear radial movement of the arms 168—168. The reversible radial movement of the arms causes the fingers 170 to cooperatively extend and retract to pick up and release wafers 17 by edge contact.

Referring primarily to FIGS. 17 and 19, the approximately parallelpiped four-bar link configuration is provided by mounting the gripping finger arm 168 in spaced relationship to the axis 167 of pivotal hub 166 by mounting the arm 168 to link 180 which is connected to an arm or link 172 which is an integral part of the hub 166; and by a third arm or link 174 which is attached at one end to the link 180 at arm 168 and at the opposite end to the base 160 at 175. In the illustrated wafer gripper, the link 174 is actually one arm of an L-shaped flexible member 176. The link 174 is attached by screws to the mounting block 178, which is rigidly attached to the base 160 by a pair of screws. (Please note, mounting block 178, FIG. 17, forms point 175 in the FIG. 19 schematic.) The other arm 180 of the L-shaped member 176 is attached to the hub 166 and forms a resilient base for the partially overlapping gripper arm 168, which, as mentioned, is mounted thereon. The L-shaped member 176 is, in effect, a flexible spring which can pivot slightly at the mounting block 178, at the intersection of links 180/174, and at the intersection of links 180/172, to provide the necessary movement for converting reversible rotation of the hub 166 into radially inward/outward movement of the cooperating gripping fingers. As shown in FIG. 19, the described construction provides a four bar link in which the input link is arm/link 172 and the non-moving link is defined between the gripper hub axis 167 and the attachment point 175 of arm/link 174. This arrangement provides movement of link 180 and wafer gripper arm 168 which is approximately parallel to the non-moving link defined by points 167 and 175.

Venting and Roughing System

One very rigorous objective of the present wafer etcher system is to minimize contaminants. The desired contamination-free, particulate-free environment is achieved, first, by minimizing the susceptibility to contamination of the individual steps or stations of the wafer handling system (including particulate generation during the operation of the individual stations) and, secondly, minimizing the transfer of contaminants from one station to the next.

The first aspect, that is, minimization of the introduction or generation of contaminants, derives from the previously discussed design and operation of the individual system components or stations. In this respect, the robot 60, the indexer assembly 66, and the shuttle 70 are designed to perform their individual wafer handling functions without introducing contaminants into the system, either as a result of their mechanical operation per se (for example, due to frictional contact between internal moving parts) or as a result of contact with the wafers. Performing the entire, cassette-to-cassette loading and unloading operation in a load lock system 7 also greatly decreases the introduction of contaminants during the wafer handling process.

The load lock 7 per se is also critical regarding the second aspect, that is, isolation of one system or station from the contaminants generated by another system or sequence or station. The overall roughing system, described previously, and the system for venting nitrogen into the load lock chamber when vacuum is broken are designed to establish laminar fluid flow, which does not pick up or transfer particles. Referring again to FIG. 1, the nitrogen vent system includes nitrogen supply line 181 which incorporates valve 183 and fixed diameter venturi 185. Line 182 includes valve 184 for bypassing venturi 185 and associated valve 183.

In operation of the nitrogen vent system, with valves 183 and 184 open and closed, respectively, nitrogen flow is through the venturi restriction and at a relatively low flow rate (slow venting). With valve 184 open and valve 183 closed, the bypass line 182 provides an unrestricted high flow rate (regular venting).

Similarly, as described previously, roughing valves 36 and 38 provide slow and regular roughing operation.

During slow venting/roughing operation (and partly as the result of the system filters described below), laminar fluid flow is established into/out of the load lock chamber, rather than turbulent flow, because of the slower flow rates provided by the slow rough and slow vent lines. During laminar flow, the velocity of the fluid flow along surfaces in zero, whereas for turbulent flow viscous forces associated with the non-zero velocity of the fluid can pick up and transfer particles. For the zero velocity associated with laminar flow, there is no viscous force present to pick up any particles. Thus, the use of an initial slow venting/roughing cycle preceding the regular venting/roughing cycle substantially eliminates the transfer of particulates within the load lock system onto wafer surfaces.

Filter System

The load lock 7 and robot 60 include a unique filtering system which, among several features, (1) confines any particulates generated within the robot housing 110 to that housing, and thereby avoids the use of an atmospheric pressure housing which must be vacuum sealed from the load lock chamber, and (2) removes particulates from the lock chamber itself and (3) cooperates with the slow vent and slow rough operations to provide laminar, non-turbulent ambient gas flow within the load lock.

Referring to FIGS. 1 and 13, the filter system includes three replaceable filters. The first filter 186 is mounted within an orifice 187 on the bottom side of the robot housing 110, (FIG. 13), whereas the second and third filters are cylindrical filters 188 and 189 which are mounted respectively on the load lock venting system inlet line 181 and to the vacuum roughing line 37 (FIG. 1).

The first, robot filter 186 permits the robot housing 110 to be maintained at the same pressure as the load lock chamber itself, yet isolates these two enclosures (housing and load lock) from one another in the sense of preventing transfer of contaminants. The robot housing filter 186 filters particles down to 0.000004 inch ($4 \times 10^{-6}$ in.) diameter in size and permits the passage of gas between the housing enclosure and the internal load lock chamber itself. Thus, any particulates generated within the robot housing 110 are confined to the enclosure. This is particularly important during the venting of the load lock chamber to atmospheric pressure and during pumping down of the load lock chamber to vacuum, since gas flow in and out of the housing could otherwise transfer particulates generated within the housing into the load lock chamber itself. The robot filter 186 comprises electrostatic filter material which in addition to this normal filtering action, also traps and retains particles from the ambient. Thus, in addition to confining to the housing 110 any particulates or contaminants which were generated within the housing, the filter 186 also removes and traps contaminants from the housing ambient and has the added advantage of trapping and removing particles from the load lock chamber ambient. In short, the robot filter 186 both prevents the introduction of particulates from the robot housing into the load lock chamber, and also lowers the existing particulate level within the load lock chamber by trapping particles which come into contact with the filter during random circulation and during venting-induced and vacuum-induced gas flow into and out of the robot housing 110.

In permitting a vacuum robot chamber which communicates with the load lock chamber without contamination, this filter approach avoids the necessity of placing a sealed, atmospheric pressure robot enclosure within the load lock chamber. Such a system would require, for example, vacuum-tight sliding seals for each of the robot support shafts 142—142. Such a system would also present the ever present risk of seal deterioration or failure allowing air to leak from the relatively high pressure of the robot housing into the low pressure of the load lock chamber and forcing particles into the load lock chamber.

The cylindrical vent filter 188 is mounted on the pressurized gas (nitrogen) inlet 181 which is used to bring the chamber up to atmospheric pressure. This filter eliminates particulates from the inlet gas flow. Similarly, the cylindrical roughing filter 189 is mounted on the "rough" vacuum exhaust line 37 for isolating the load lock chamber from the roughing system. In addition, these two filters slow down and control the inlet and exhaust air/gas flow, making the flow less turbulent and more laminar. This decreases the inherent tendency of turbulent gas flow to stir up and/or generate particles in the load lock chamber itself which can then be transferred onto the wafer handling apparatus and the wafers themselves.

The two filters 188 and 189 operate as follows to contribute to non-turbulent laminar flow. As will be appreciated, the flow rates through the inlet line 181 and through the inlet filter 188 are equal. Similarly, the flow rates through the roughing filter 189 and the vacuum roughing outlet line 37 are equal. However, the area of the approximately one-inch diameter (0.8 sq. in) inlet 37 is much less than the total area of the 3 inch diameter $\times$ 8 inch long cylindrical inlet filter 186 (75 sq. in.). Similarly, the area of the two-inch diameter roughing outlet line 37 (3.14 sq. in.) is much less than the overall area of the 4 inch diameter $\times$ 12 inch high cylindrical roughing filter (150 sq. in.). For the equal flow rates, the velocities through the pipes and respective filters are inversely proportional to the areas. Thus, the inlet velocity is slowed by a large factor in traversing the inlet filter 188 and the roughing vacuum velocity is similarly slowed by a large factor in traversing the roughing filter 189. The filter media also slows the flow of gases that pass through them. As a consequence, turbulent flow at the pipes 37 and 181 is reduced, as is the tendency to stir up or knock off particulates within the load lock chamber.

In a presently preferred working embodiment, the robot housing filter 186 is a 2 inch diameter electrostatic filter available from Minnesota Mining and Manufacturing Company as filter type 6 Filtrete No. 4143. The inlet filter 186 is a 3 inch diameter $\times$ 8 inch long Millipore cylindrical filter. The roughing filter 188 is a 4 inch diameter $\times$ 12 inch long Millipore cylindrical filter. Tests of the system have shown that, on the average, no particles greater than 0.000040 inch diameter in size are generated during each cyle on the wafer.

Autoloader Operation

Referring now to FIGS. 1 and 5, the system base plates 11, 13 and the process subframe 19 cooperate in maintaining precise dimensional relationships between the wafer handling system and the hexode for the robotic loading/unloading operations. This is particularly advantageous when automated loading (autoloading) with position memory mapping is used. To minimize thermal-induced and pressure-induced interaction and distortion, the separate base plates 11 and 13 are used. The base plates are connected by tie plates 190, FIG. 1, to restrict the number of degrees of freedom to one of rotation only and keep the base plates from moving. The processing chamber subframe 19 is constructed of standard tubing or bars in the configuration outlined in FIG. 5, is mounted to the processing chamber base plate at 105—105, and extends under the loading chamber Z-axis and supports the robot 60 (see also FIGS. 15A and 15B). The subframe 19 makes the robot an extension of the cathode 18 and minimizes any dimensional changes or distortions between the robot and the cathode which could otherwise result from pressure and temperature differences between the processing chamber and the loading chamber.

The controller-controlled operation of the autoloader is discussed below. The operational details of the indexer 66, shuttle 70 and robot 60 have been discussed in detail above. The description here is based upon the use of the controller 10, specifically a VME (Versa Modular European) system controller. Referring to FIG. 20, the controller 10 includes a 16 bit 68000 microprocessor 191 which is interfaced via VME address and data buses 192—192 to a step motor controller circuit 193 and an encoder counter 194. The step motor controller circuit 193 comprises the CY525 IC chip which is available commercially from Cybernetics, San Gregorio, Calif. The encoder/counter 194 is a standard up/down counter. The controller typically can also include high speed memory capacity in the form of dynamic random access memory (DRAM), erasable read only memory (EROM) for system programs, static RAM (SRAM) battery back-up memory and non-volatile, electrically alterable EEPROM memory 195 for use in position memory mapping, described subsequently.

Responsive to the ASCII motor control commands, the step motor controller 193 provides a train of four phase motor clock and direction drive signals to the bipolar chopper driver 196, which provides power signals to the windings of reversible step motor 197 to control the operation, including direction, of the motor. In the present embodiment of system 5, five step motors 197 are used: one each to control R, $\theta$, and Z robot movement and load and unload indexing. Commercially available digital shaft encoders 198—specifically quadrature optical encoders—are used to provide direction and clock signals to the encoder buffer board 199, which "squares" the waveform of the signals from the encoders for input to the encoder counter 194 for use in controlling step motor operation. Conventionally, the direction signals are used by the encoder counter to decrement or increment the count.

As indicated at 101, controller 10 of the autoloader control system also provides digital signals for controlling the operation of solenoid valves which control the travel cylinder (unload and load sides) and home cylinder, described previously, operate the shuttle blade, and control the load lock chamber doors 82—82. Other digital signal lines control transistor switching circuits 107 which control the opening and closing operation of the gripper motor 164. As shown schematically at 102, digital input signals from redundant infrared blade sensors associated with the shuttle blade 90 provide failsafe monitoring of whether wafers are on/off the load and unload blades to permit stopping of the autoloader operation. Finally, as discussed more fully below, amplified analog signals from the sensor 104 of gripper 120 of the autoaligning system 103 are converted to digital signals by A/D converter 106 for autoalignment and memory mapping of the relative positions of the robot 60 and the hexode wafer (pedestal) positions.

Initially during autoloader operation, and referring to FIGS. 1 and 5, with the doors 82—82 held in the horizontal opened position by their respective cylinders 84—84, the cassettes from a previous processing operation are removed from the indexers 67,68 and replaced with cassettes containing wafers which are to be etched, in the case of the load indexer 67, and with empty cassettes, in the case of the unload indexer 68. The wafers are conveniently oriented by the flat finding mechanism 71 (FIG. 6) so that the flats are in a bottom down center position. Then, the cylinders 84—84 are actuated to pivot the doors 82—82 closed to seal the load lock chamber 7 and pivot the indexers 66,67 to the vertical indexing position with the wafers oriented horizontally. At this time, the process chamber 6 is under vacuum. The load chamber 7 is first roughed by the remote roughing pump through filter 189 and rough vacuum line 37, then final pumped by the cryo pump 34 to a pressure of 0.1 mTorr. When this pressure is reached, the gate valve 9 is opened allowing full communication between the chambers 6 and 7.

Referring also to FIGS. 12A and 12B, initially, the travel cylinder of the shuttle 70 pivots the blade 90 clockwise to so that the load blade 90L is in position 67 and the load blade is at transfer position 73. At this position, the unload cassette 67 indexes downwardly to load an unprocessed wafer onto the end 90L of the blade. The robot 60 is pivoted into the process chamber 6, indexed along the Z-axis to the first pedestal to be off-loaded, and then the gripper head 120 is extended so that arms 64—64 release the clips 50—50 (FIG. 5). The wafer is now resting on the supports 48—48 (FIG. 2). The arms 168—168 (FIG. 13) are actuated to engage the wafer, then the gripper head 120 is retracted and the robot pivots counterclockwise to the transfer position 73, then the gripper head is extended and the arms 68—68 are activated to release the wafer onto the unload blade end 90U. Next, after retracting the gripper head 120, as shown in FIG. 12B, the shuttle 70 pivots the blade 90 counterclockwise to position the unprocessed wafer at transfer position 73 and position the unloaded wafer in the unload position 68. The unload cassette 68 then indexes upwardly to pick up the processed wafer from blade 90U. At the same time, the robot 60 reverses its previous operation to pick up the unprocessed wafer at the transfer position 73, rotate into the processing chamber 6 and load the wafer onto a vacant pedestal position. The robot 60 then indexes upwardly or downwardly on the elevator to the next of the three pedestal positions on the particular hexode face 20, repeats the unload and load sequences, then indexes to the last of the three pedestal positions and completes the final unload and load sequences for that hexode face. The hexode is then rotated 60° by its motor to present the next face 20 for unloading and loading and the previous sequence is repeated for the second face. The hexode indexing and the triple unload and load sequence are then performed in seriatim four additional times to complete the unloading and loading of the six face hexode.

Following the completion of the unloading and loading, the robot 60 is rotated counterclockwise out of the processing chamber, the gate valve 9 is closed and the next etching sequence is commenced. At this time or subsequently, the vacuum can be released from the load lock chamber 7 and the indexer doors 82—82 opened to initiate the next cassette unloading and loading sequence.

Autoaligning System

Prior to the use of the system 5 to process wafers, and periodically during use, the position of each pedestal 22 relative to the robot 60 is measured and stored in the controller 10 memory. This memory mapping is used in accurately positioning the robot gripper head 120 for loading/unloading wafers 17—17 at the hexode 18. Such automatic sensing of the target (pedestal) position is very useful for robotic systems when the targets may be moving or have unpredictable position changes in time. Many sophisticated robots use vision systems to perform these tasks. However, the shortcomings of the vision systems are high cost, low reliably and in many cases limited applicability due to space and environment restrictions. The present adaptive system 115, illustrated in FIG. 21, provides reliable position sensing. The system 115 includes the robot 60, including the gripper 120 which mounts sensor 104. The sensor 104 is the heart of the system 115. In a preferred embodiment, it is the HP HEDS-1000 High Resolution Optical Reflective Sensor. The optical spot (700-nm wavelength) is focused to 0.19-mm dia. at 4.5-mm from the detector window. See FIG. 22. This detector was originally designed for BAR code scanner readers due to its small focused spot size. However, because of its sensitivity to the axial distance it has proven ideally suitable for position sensing. Referring further to FIG. 21, the commercial IR sensor unit 104 is adjustably mounted behind the transparent gripper base 160 for transmitting a focused IR beam onto the pedestals 22 and applying to the controller 10 a signal containing information indicative of the distance between the sensor unit and the pedestal 22. For example, by determining the sensor-to-pedestal distance at two points on a single pedestal and by applying triangulation techniques, the precise angle of inclination and travel distance can be calculated for each pedestal 22.

In particular, output from the sensor 104 is transmitted via digitizing circuit 103 (FIG. 20) to the controller 10 for use in controlling the three (R,θ,Z) robot stepper motors. The controller 10 is programmed to determine the pedestal position and angular orientation using the algorithm shown in FIG. 21. Scanning data is derived for transverse scanning (R distance), and axial scanning along the pedestal surface to determine the location of the pedestal slot 116 along the Z axis.

In order to determine the exact location of a pedestal 22, the following steps are taken. First, focusing is done near the bottom of the pedestal 22 in question, at coordinates (U1,V1), where U is the horizontal gripper (end effector) coordinate and V is the vertical gripper coordinate, (the angle of gripper face with respect to the vertical is Th).

A second focusing point is taken near the top of the pedestal (U2,V2). From the slope of the line connecting points 1 and 2, $$Th = atan((U2-U1)/(V2-V1))$$

gives the angle of the pedestal or the proper alignment for the gripper. After this, a point near the slot 116 is focused and scanned to determine the proper slot or pedestal height (U3,V3). Then the gripper is moved to the robot center height at the angle determined from last step, and at this point another refocusing is performed to get the final focus distance and the gripper is again moved to that position. The resulting coordinate information defining the (R,θ,Z) pedestal location is then stored in the EEPROM.

Performance

The above-described system 5 is designed to completely unload and reload an 18 wafer hexode 18 in four minutes and 30 seconds, for an average wafer transfer time of about 7.5 seconds. The loading process adds an average of less than one particle per wafer per transfer. Particle size is equal to or greater than one micrometer in diameter. The loader outgases into the vacuum chamber at such a rate that the pressure in the load chamber increases at a rate of less than 0.5 millitorr per minute. The load chamber is reduced to $10^{-1}$ millitorr and operates at $10^{-1}$ millitorr. Finally, the autoloader is designed to transfer 100,000 wafers without adjustment. This is equal to 36 wafer transfers/cycle×40 process cycles/day for 60 days.

It is apparent from the foregoing that a new and improved apparatus has been provided for loading an unloading wafers in a semiconductor processing system. While an etcher system has been described, the invention applies to other systems as well, such as deposition systems and ion implant systems. A presently preferred embodiment has been described in detail, and, as-will be apparent to those familiar with the art, changes and modifications can be made without departing from the scope of the invention as defined by the following claims.

We claim:

1. A chuck for releasably picking up articles such as semiconductor wafers, comprising: a base; a hub mounted on the base for reversible rotation and including a plurality of first arms extending therefrom for rotation with the hub along the base and about a rotational axis of the hub; at least a plurality of second arms, each being attached at an attachment point to an associated first arm; at least a plurality of third arms, each being pivotally attached at spaced points thereon to the base and to the second arm at a point on the second arm spaced from the attachment point of the first arm; whereby the reversible rotation of the hub is converted into collective inward and outward movement of the second arms; means mounted on the second arms for cooperatively engaging and picking up and releasing said articles during said inward and outward movement of the second arms; and means for reversibly rotating the hub.

2. The chuck of claim 1 wherein the rotating means comprises a motor having a rotatable shaft on which the hub is mounted.

3. The chuck of claim 1 wherein the article engaging means is a transverse-extending finger.

4. A chuck for picking up articles comprising:
a base;
a rotatable shaft extending from the base;
at least a plurality of four-bar link arrangements actuated by the shaft, each such arrangement including: a first, input link having first and second spaced points therealong and being mounted at one point to the shaft; a second link including an article-engaging means mounted thereto, the second link being pivotally connected to the second point of the first link; a third link having first and second spaced points therealong and being pivotally mounted at one point to the base at a point spaced from the shaft to thereby define a region of the base between the shaft and the third link as a fourth non-movable link, the third link being pivotally connected at its second point to the first link; the base and the other links describing a quadrilaterally configured four-bar link arrangement; and whereby the third link defines a path of movement of the second link;
the four-bar link arrangements being positioned at selected intervals about the shaft such that reversible rotation of the first or input links by the shaft moves the first links and their article-engaging means reciprocally inwardly and outwardly relative to the shaft to cooperatively pick up and release the article; and
means for reversibly rotating the shaft.

5. The chuck of claim 4, wherein the second and third links comprise a flexible, L-shaped member connected proximate an end of one leg thereof to the base and connected proximate an end of another leg thereof to the second end of the first link, for converting movement of the hub and the first link into an inward and outward movement of the second link.

6. A chuck for picking up articles comprising:
a flat base having rotatable shaft means extending therefrom;
at least a plurality of quadrilateral four-bar link mechanisms mounted on the base, each mechanism having an input link and a second link mounted to the base at spaced points for reversible pivotal movement; an output link pivotally attached at spaced points thereon to the input link and to the second link, whereby the output link is reciprocally movable in response to the reversible pivotal movement of the input link; and an article gripper member mounted on the output link;
said four-bar link mechanisms being positioned in a radial array about the shaft means and with the input links thereof connected to the shaft means for rotation therewith, such that the output links cooperatively and responsively move the article gripper members inwardly and outwardly for cooperatively gripping and releasing said article positioned therebetween; and
means for reversibly rotating the shaft means.

7. A chuck for releasably picking up articles such as semiconductor wafers, comprising:
a base;
a hub mounted on the base for reversible rotation and including a plurality of first arms extending therefrom for rotation with the hub along the base and about a rotational axis of the hub;
an array comprising at least a plurality of flexible second arms, each second arm being attached to an associated first arm;
at least a plurality of flexible third arms, each third arm being attached at spaced points thereon to the base and to the second arm at a point on the second arm spaced from the attachment point of the first arm, so that the reversible rotation of the hub is converted into collective inward and outward movement of the second arms;
a plurality of means mounted on the second arms for cooperatively engaging and picking up and releasing said articles during said inward and outward movement of the second arms; and
means for reversibly rotating the hub.

8. The chuck according to claim 7 wherein the rotating means comprises a motor having a rotatable shaft on which the hub is mounted.

9. The chuck according to claim 7 wherein the means for picking up and releasing the articles is a finger mounted on the second arm and extending transverse to the array of arms.

10. The chuck of claim 7 wherein the second arm and the third arm comprise a flexible, L-shaped member connected proximate the end of one leg thereof to the base and connected proximate an end of another leg thereof to a second end of the first arm, for converting movement of the hub and the first arm into the inward and outward movement of the second arm.

11. In combination with the chuck of claim 7, a wafer processing system comprising
a processing chamber;
a load lock chamber; and a robotic wafer transfer system for transferring wafers bidirectionally (1) between a first position which is a substantially vertically oriented position on a wafer support within the processing chamber and a spaced second position which is a substantially horizontally oriented wafer support position within the load lock chamber, and (2) between the first and second vertical and horizontal orientations associated with the respective first and second positions, the combination further comprising:

an elevator mounted within the load lock chamber for vertical movement therein;

a housing mounted for pivotal movement on the elevator and having at least one retractable arm extending therefrom mounting the chuck;

means for pivoting the housing and the chuck between the vertical and the horizontal orientations to orient the chuck for loading and unloading wafers at each of the first and second positions;

means for moving the elevator vertically to position the chuck at the first and second positions; and means for extending and retracting the arm to position the chuck for picking up and releasing wafers at the first and second positions.

12. The combination of claim 11 further comprising:
an optical sensor attached to the chuck for generating electrical signals representative of a distance between the chuck and at least the first position; means responsive to said electrical signals for determining an angular orientation of the first position; memory means for storing said angular orientation and distance information; and electronic driver means responsive to the stored information for controlling the wafer transfer system to move the chuck to the first position for loading and unloading the wafers.

13. The combination of claim 12 wherein the housing includes an aperture which is covered by a filter, for permitting transfer of ambient gas between the housing and the processing chamber without particulate transfer.

14. The combination of claim 13 wherein the load lock chamber comprises a gas inlet and a gas outlet, and further comprises:

a first filter mounted on the gas inlet to the load lock chamber for substantially eliminating the particulates from the inlet gas flow and comprising a large surface area relative to a cross-section area of the gas inlet for reducing the gas flow velocity through the first filter relative to the gas inlet to provide non-turbulent laminar gas flow into the load lock chamber; and a second filter mounted on the gas outlet from the load lock chamber for isolating the load lock chamber from the gas outlet and comprising a large surface area relative to the cross-section area of the gas outlet for reducing the gas flow velocity through the second filter relative to the gas outlet to provide non-turbulent laminar exhaust flow.

15. The combination of claim 13 wherein the housing filter comprises an electrostatic filter material which retains the particles.

16. A chuck for picking up articles comprising:
a base;
a rotatable shaft extending from the base;
at least a plurality of four-bar link arrangements actuated by the shaft, each such arrangement including:
a first, input link having first and second spaced points therealong and being mounted at the first point to the shaft;
a flexible second link including an article-engaging member mounted thereto, the second link being mounted to the first link at the second point thereof;
a flexible third link having first and second spaced points therealong and being mounted at the first point thereon to the base at a point on the base spaced from the shaft to thereby define region of the base between the shaft and the third link as a fourth non-movable link,
the third link being mounted at the second point thereon to the second link, whereby the base and the other links describe a quadrilaterally configured four-bar link arrangement and the third link defines a path of movement of the second link;
the four-bar link arrangements being positioned at selected intervals about the shaft such that reversible rotation of the first input links by the shaft moves the first links and their article-engaging members reciprocally inwardly and outwardly relative to the shaft to cooperatively pick up and release the article; and
means for reversibly rotating the shaft.

* * * * *